(12) United States Patent
Kwon et al.

(10) Patent No.: US 11,233,185 B2
(45) Date of Patent: Jan. 25, 2022

(54) DISPLAY DEVICE AND METHOD OF FABRICATING THE SAME

(71) Applicant: LG Display Co., Ltd., Seoul (KR)

(72) Inventors: KyuOh Kwon, Daejeon (KR); JaeMin Sim, Jeongeup-si (KR); SeungJun Lee, Paju-si (KR); Junghun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 110 days.

(21) Appl. No.: 16/600,330

(22) Filed: Oct. 11, 2019

(65) Prior Publication Data

US 2020/0119244 A1 Apr. 16, 2020

(30) Foreign Application Priority Data

Oct. 16, 2018 (KR) .................. 10-2018-0123052

(51) Int. Cl.
*H01L 33/62* (2010.01)
*H01L 27/12* (2006.01)
*G09G 3/32* (2016.01)
*H01L 33/50* (2010.01)
*H01L 33/58* (2010.01)

(52) U.S. Cl.
CPC .............. *H01L 33/62* (2013.01); *G09G 3/32* (2013.01); *H01L 33/504* (2013.01); *H01L 33/58* (2013.01); *G09G 2310/0275* (2013.01)

(58) Field of Classification Search
CPC ....... H01L 33/62; H01L 33/504; H01L 33/58; G09G 3/32

USPC .................................................. 257/40, 79
See application file for complete search history.

(56) References Cited

U.S. PATENT DOCUMENTS

| | | | |
|---|---|---|---|
| 2015/0169011 A1* | 6/2015 | Bibi ................... | H01L 31/0216 345/175 |
| 2017/0179097 A1* | 6/2017 | Zhang ................ | H01L 33/0093 |
| 2018/0012948 A1* | 1/2018 | Lee .................... | H01L 27/1218 |
| 2018/0114820 A1* | 4/2018 | Shim .................. | H01L 27/3248 |
| 2018/0175268 A1* | 6/2018 | Moon .................. | H01L 27/15 |
| 2019/0273179 A1* | 9/2019 | Iguchi ................ | H01L 33/0075 |

FOREIGN PATENT DOCUMENTS

| | | |
|---|---|---|
| JP | 2015-002125 A | 1/2015 |
| JP | 2015-179784 A | 10/2015 |
| KR | 10-2006-0018989 A | 3/2006 |
| KR | 10-2016-0075689 A | 6/2016 |
| KR | 10-2017-0010132 A | 1/2017 |
| KR | 10-2017-0135651 A | 12/2017 |
| KR | 10-2018-0001206 A | 1/2018 |

(Continued)

*Primary Examiner* — David Vu
*Assistant Examiner* — Brandon C Fox
(74) *Attorney, Agent, or Firm* — Polsinelli PC

(57) ABSTRACT

A display device comprises a substrate having a plurality of sub-pixels; a plurality of LEDs respectively disposed in the plurality of sub-pixels, wherein each of the LEDs comprises an emissive layer, a first semiconductor layer between the substrate and the emissive layer and a second semiconductor layer on the emissive layer; a plurality of driving units disposed under the substrate in each of the sub-pixels; and a plurality of connection units penetrating the substrate and electrically connecting at least one of the first semiconductor layer and the second semiconductor layer with the plurality of driving units.

18 Claims, 30 Drawing Sheets

(56) References Cited

FOREIGN PATENT DOCUMENTS

| | | |
|---|---|---|
| KR | 10-2018-0051006 A | 5/2018 |
| KR | 10-2018-0079078 A | 7/2018 |
| KR | 10-2018-0083020 A | 7/2018 |
| KR | 10-1895600 B1 | 9/2018 |

\* cited by examiner

DISPLAY DEVICE AND METHOD OF FABRICATING THE SAME

CROSS REFERENCE TO RELATED APPLICATION

This application claims the priority of Korean Patent Application No. 10-2018-0123052 filed on Oct. 16, 2018, which is hereby incorporated by reference in its entirety.

BACKGROUND

Field of the Disclosure

The present disclosure relates to a display device and a method of fabricating the display device, and more particularly, to a display device using micro light-emitting diodes (LEDs) and a method of fabricating the display device.

Description of the Background

Display devices employed by the monitor of a computer, a TV, a mobile phone or the like includes an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

Recently, display devices including LEDs are attracting attention as the next generation display device. An LED is made of an inorganic material instead of an organic material, and therefore has excellent reliability and a longer lifetime than a liquid-crystal display device or an organic light-emitting display device. In addition, the LEDs can be turned on and off quickly, have high luminous efficiency, are robust to impact and stable, and can display a high-brightness image.

SUMMARY

A display panel may be formed by disposing a plurality of LEDs, a plurality of driving units for driving the LEDs, and a variety of lines on one surface of a substrate. By applying a voltage to the LEDs from each of the plurality of driving units to allow the LEDs to emit light, images can be display on the surface of the substrate.

The efficiency and luminance of the display device can be improved as the area occupied by the LEDs, i.e., the emission area is increased. Unfortunately, since the LEDs, the driving units and the lines are disposed on the same surface of the substrate, there is a limitation in increasing the area of the LEDs.

It is difficult to further increase the emission area of the LEDs in the display device where the driving units, the lines and the like are disposed on the same surface with the LEDs. In view of the above, the present disclosure is directed to have devised a display device that can increase the emission area of LEDs, and a method of fabricating the display device.

As the number of LEDs disposed in the same area increases, images of a higher resolution can be displayed. Specifically, a plurality of pixels may be defined on the surface of the substrate, each of which is a unit for emitting light. In each of the pixels, a single LED and driving units for driving it may be disposed. As the number of pixels disposed on the substrate increases, higher resolution images can be displayed.

In order to increase the number of LEDs per area, it is required to dispose more driving units and lines. To dispose more LEDs, it is necessary to reduce the area occupied by the lines, driving units and the LEDs. However, there is limitation in reducing the area occupied by the semiconductor elements, the capacitors, etc. of the driving units and the lines.

It is difficult to reduce the area occupied by the driving units in order to increase the numbers of the LEDs, driving units and the lines for a high resolution display device. Under the circumstances, the present disclosure is directed to have devised a display device that can display high resolution images by increasing the number of LEDs without reducing the area occupied by the driving units, and a method of fabricating the display device.

Incidentally, in order to drive each of the LEDs, a plurality of driving units and a plurality of lines for applying a variety of voltages to the driving units are required. For example, the plurality of lines may include gate lines for applying gate voltage, data lines for applying data voltage, a common line for applying common voltage, and power lines for applying supply voltage. In addition, each of the lines may receive voltages from driving ICs through pad electrodes formed in the non-active area where no image is displayed on the outer side of the active area where images are displayed. As a display device displays image of a higher resolution, the numbers of LEDs, driving units and lines may be increased. As the number of the lines increases, the area of the non-active area has to be increased to dispose the pad electrode for applying voltage to each of the lines.

However, since no image is displayed in the non-active area, in order to provide a larger active area, it is required to reduce the non-active area for the given area of the substrate. In view of the above, the inventors of the present disclosure have recognized that it is important to reduce the non-active area of the display device in order to provide a larger active area to viewers. Accordingly, the inventors of the present disclosure have devised a display device that can reduce the non-active area, a method of fabricating a display device.

In view of the above, an object of the present disclosure is to provide a display device that can increase the emission area of a plurality of LEDs by way of mounting the LEDs and a plurality of driving units on different surfaces, and a method of fabricating the display device.

Another object of the present disclosure is to provide a display device that can improve luminance and efficiency by way of increasing the emission area of a plurality of LEDs, and a method of fabricating the display device.

Yet another object of the present disclosure is to provide a display device that can improve PPI (pixel per inch) and display high resolution images by way of increasing the number of LEDs, and a method of fabricating the display device.

Still another object of the present disclosure is to provide a display device that can reduce the non-active area without being limited by the number of a plurality of lines, and a method of fabricating the display device.

Objects of the present disclosure are not limited to the above-mentioned objects, and other objects, which are not mentioned above, can be clearly understood by those skilled in the art from the following descriptions.

According to an aspect of the present disclosure, there is provided a display device including a substrate having a plurality of sub-pixels defined thereon; a plurality of LEDs disposed on the substrate in the sub-pixels, respectively, wherein each of the LEDs comprises an emissive layer, a first semiconductor layer between the substrate and the emissive layer, and a second semiconductor layer on the emissive layer; a plurality of driving units disposed under the substrate in each of the sub-pixels; and a plurality of connection units penetrating the substrate to electrically connect the first semiconductor layer and/or the second semiconductor layer with the driving units. The driving units are disposed under substrate while only the LEDs are disposed on the substrate, the emission area of each of sub-pixels can be improved.

According to another aspect of the present disclosure, there is provided a display device including a plurality of light-emitting elements emitting light; a substrate having a first surface on which the plurality of light-emitting elements mounted; a plurality of driving units and a plurality of lines mounted on a second surface of the substrate so as to increase an emission area of the light-emitting elements, wherein the second surface is opposed to the first surface; and a plurality of connection units, wherein ends of the connection units are in contact with each of the light-emitting elements on the first surface, while opposite ends of the connection units are extended from the ends to penetrate through the substrate and in contact with the driving units and lines on the second substrate. Accordingly, only the light-emitting elements are disposed on the first surface of the substrate, the non-active area where no image is displayed can be reduced on the first surface.

According to yet another aspect of the present disclosure, there is provided a method of fabricating a display device, including: forming a plurality of LEDs on a substrate, each of the LEDs comprising a first semiconductor layer, an emissive layer on the first semiconductor layer, and a second semiconductor layer on the emissive layer; and forming a plurality of driving units and a plurality of lines under the substrate, wherein the LEDs are electrically connected to the driving units and the lines by a plurality of connection units penetrating through the substrate. Accordingly, by disposing connection units penetrating through the substrate, it is possible to electrically connect the LEDs with the driving units and the lines disposed on different surfaces.

Other detailed matters of the exemplary aspects are included in the detailed description and the drawings.

According to an exemplary aspect of the present disclosure, the emission area of a plurality of LEDs can be increased, so that a high resolution image can be displayed.

According to an exemplary aspect of the present disclosure, the number of LEDs disposed on the substrate, i.e., the number of a plurality of sub-pixels can be increased, so that a display device can have a higher PPI (pixel per inch).

According to an exemplary aspect of the present disclosure, a display device having a high resolution can be implemented by way of disposing more LEDs on a surface of the substrate.

According to an exemplary aspect of the present disclosure, by disposing a plurality of driving units and a plurality of lines on a surface of the substrate different from the substrate on which a plurality of LEDs is disposed, so that the non-active area can be reduced on the surface of the substrate on which the LEDs are disposed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
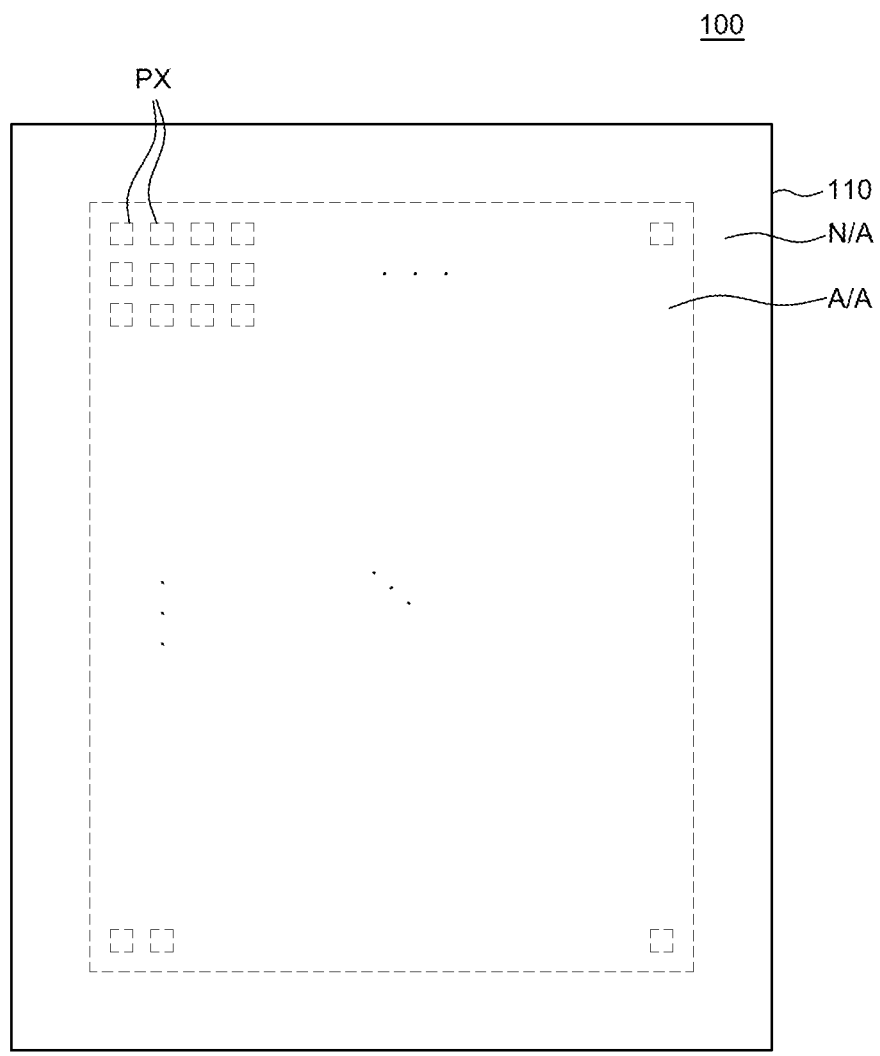
FIG. 1 is a schematic plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a schematic plan view of a display device according to an exemplary aspect of the present disclosure. For convenience of illustration, FIG. 1 shows only a substrate 110 and pixels PX among a variety of elements of a display device 100.

The substrate 110 supports a variety of elements included in the display device 100 and may be made of an insulating material. For example, the substrate 110 may be made of glass, a resin or the like. In addition, the substrate 110 may be made of a material including polymer or plastic, or may be made of a plastic material having flexibility.

The substrate 110 includes an active area A/A and a non-active area N/A.

The active area A/A is defined as an area for displaying an image, in which a plurality of pixels PX is disposed. In each of the plurality of pixels PX in the active area A/A, a light-emitting element and driving circuitry for driving the light-emitting element may be disposed. For example, in each of the plurality of pixels PX, LEDs, semiconductor elements for driving the LEDs, etc. may be disposed.

The non-active area N/A is defined as an area where no image is displayed, and a variety of lines, driver ICs, and the like for driving the pixels PX disposed in the active area A/A are disposed therein. For example, a variety of ICs such as a gate driver IC and a data driver IC may be disposed in the non-active area N/A.

In the active area A/A of the substrate 110, a plurality of pixels PX is defined. Each of the plurality of pixels PX is a unit that emits light and may include a plurality of sub-pixels. A single pixel can emit light of a variety of colors by combining the sub-pixels. For example, the plurality of pixels PX may include, but is not limited to, red sub-pixels, green sub-pixels, and blue sub-pixels.

Hereinafter, the pixels PX will be described in more detail with respect to FIG. 2.

Figure 2:
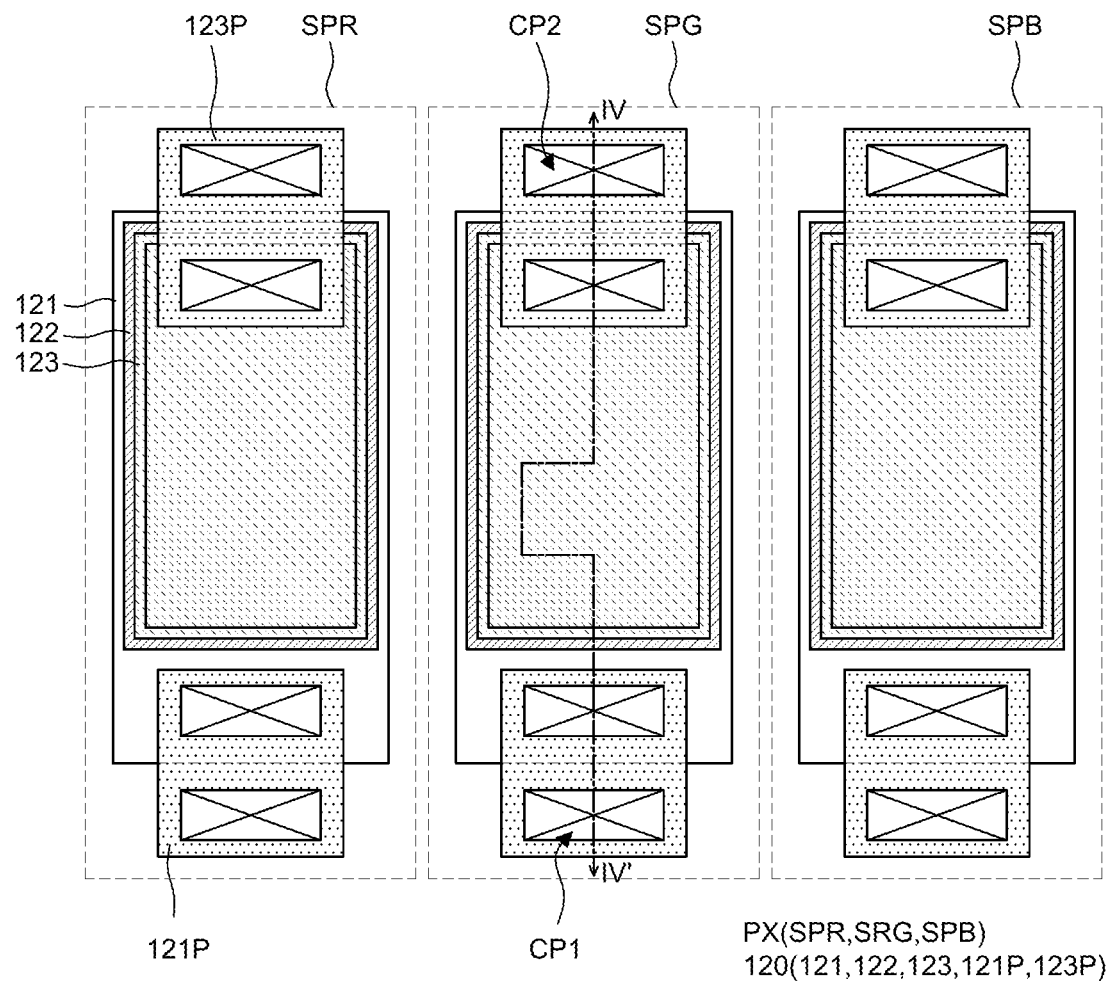
FIG. 2 is an enlarged plan view of a single pixel on the upper surface of a substrate of a display device according to an exemplary aspect of the present disclosure.
Figure 3:
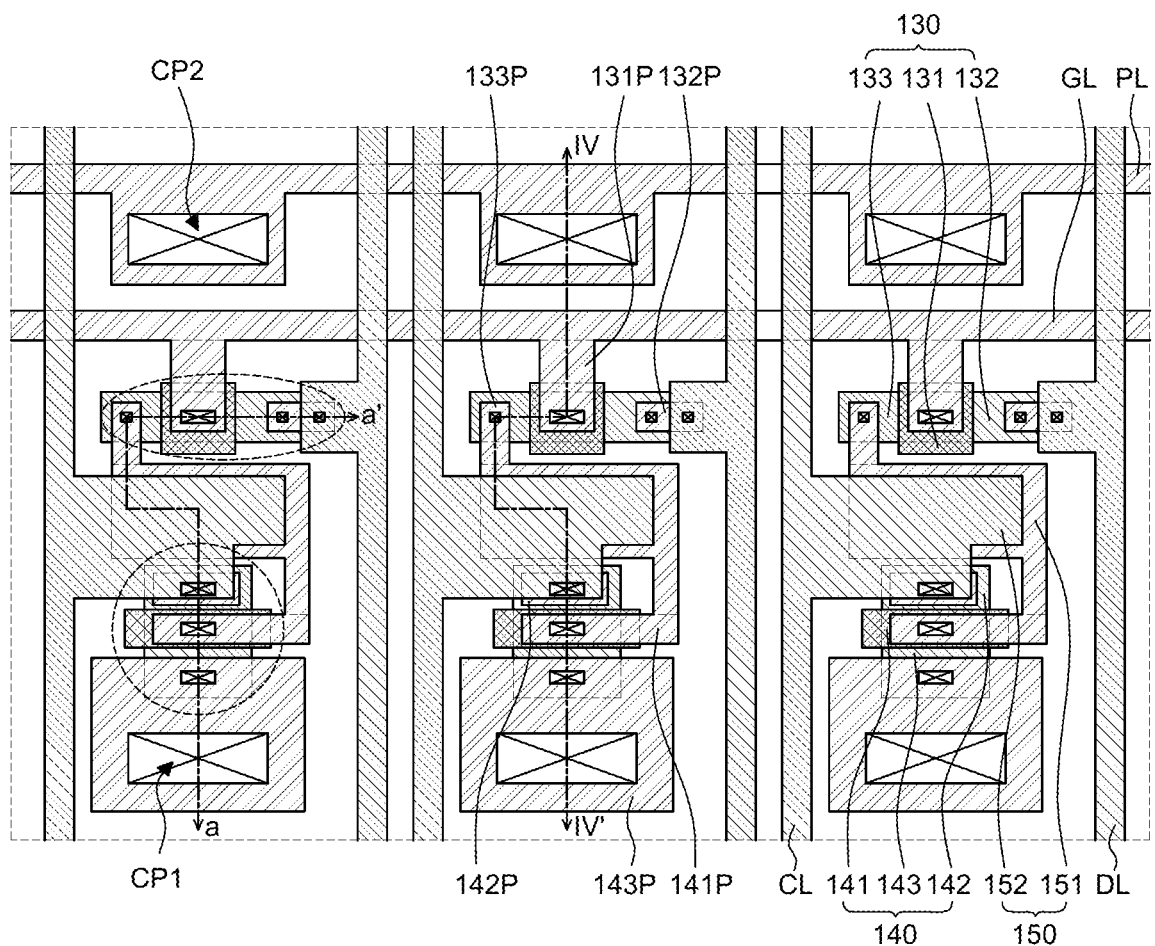
FIG. 3 is an enlarged plan view of a single pixel on the lower surface of a substrate of a display device according to an exemplary aspect of the present disclosure.
Figure 4:
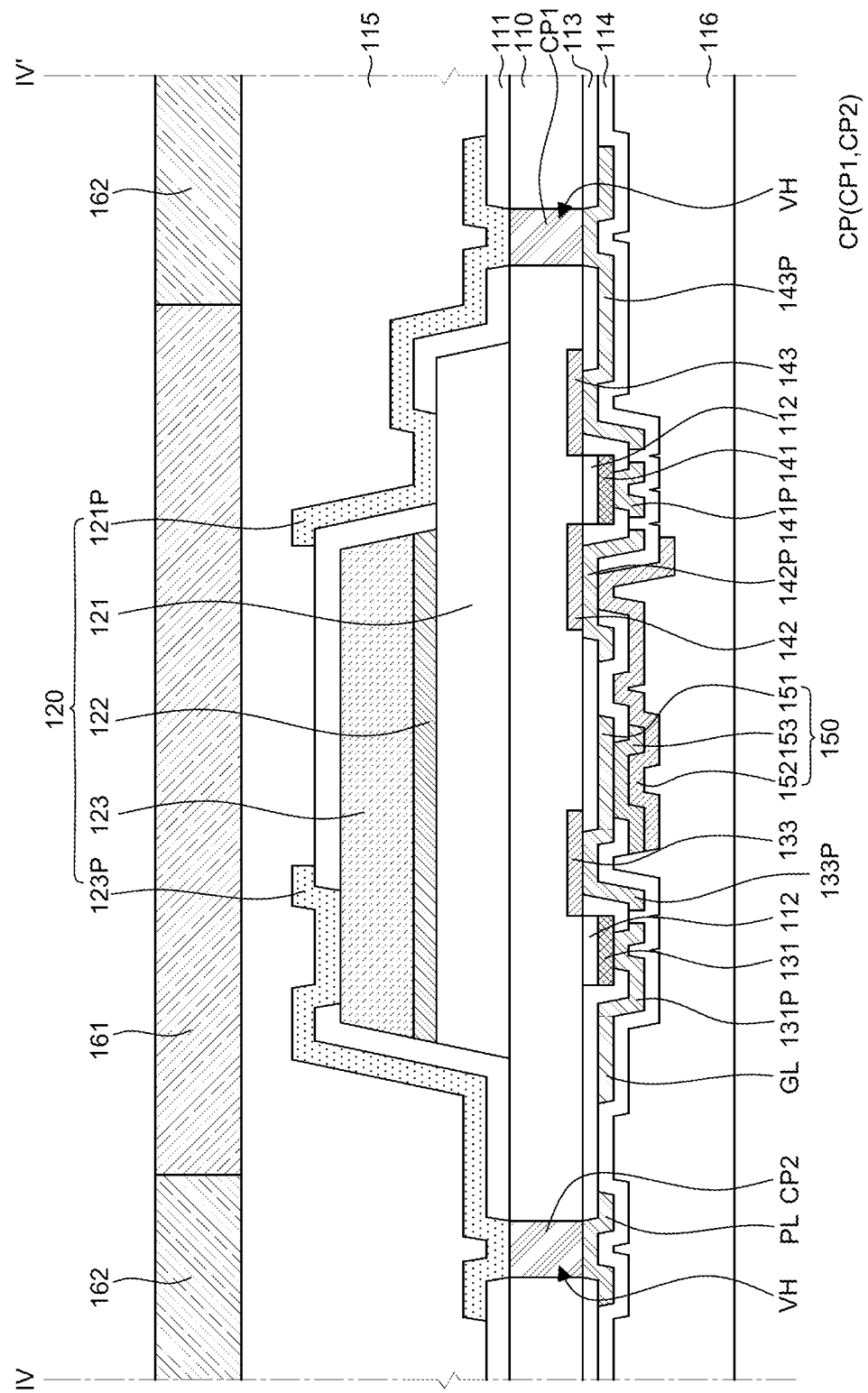
FIG. 4 is a cross-sectional view taken along line IV-IV' of FIGS. 2 and 3.

FIG. 2 is an enlarged plan view of a single pixel on the upper surface of the substrate of a display device according to an exemplary aspect of the present disclosure. FIG. 3 is an enlarged plan view of a single pixel on the lower surface of the substrate of a display device according to an exemplary aspect of the present disclosure. FIG. 4 is a cross-sectional view taken along line IV-IV' of FIGS. 2 and 3. Referring to FIGS. 2 to 4, a display device 100 according to an exemplary aspect of the present disclosure may include a plurality of LEDs 120, a first passivation layer 111, a first protective layer 115, a plurality of light-converting layer layers 161 and a plurality of light-blocking 162 disposed on an upper surface of a substrate 110, and a plurality of driving units, a plurality of gate lines GL connected to the driving units, respectively, a plurality of data lines DL, a plurality of power lines PL, a plurality of common lines CL, a gate insulating layer 112, a second passivation layer 113, a third passivation layer 114 and a second protective layer 116 disposed on a lower surface of the substrate 110, and a plurality of connection units CP penetrating through the substrate 110.

Referring to FIGS. 2 and 4, the plurality of LEDs 120 is disposed on the substrate 110. Specifically, the LEDs 120 are disposed in a plurality of sub-pixels SPR, SPG and SPB, respectively. The LEDs 120 are light-emitting elements that emit light when a voltage is applied thereto. The LEDs 120 include LEDs for emitting red light, green light and blue light. The LEDs 120 can represent a variety of colors including white as they are combined.

The LEDs 120 may have in a variety of structures such as a lateral, a vertical, and a flip chip structures. The LED having the lateral structure includes an emissive layer and an n-type electrode and a p-type electrode arranged horizontally on both sides of the emissive layer. The LED having the lateral structure can emit light by combining electrons supplied through the n-type electrode and holes supplied through p-type electrode. The LED having the vertical structure includes an emissive layer and an n-type electrode and a p-type electrode arranged on upper and lower sides of the emissive layer, respectively. Like the LED having the lateral structure, the LED has the vertical structure can also emit light by the combination of electrons and holes supplied from the electrodes. The LED having the flip chip structure has substantially the same structure as the LED having the lateral structure. It is to be noted that the LED having the flip chip structure may be attached directly to a printed circuit board or the like, without a medium such as a metal wire. In the following description, it is assumed that the LEDs 120 of the display device 100 according to the exemplary aspect of the present disclosure have the lateral structure for convenience of illustration. It is, however, to be understood that the present disclosure is not limited thereto.

Each of the LEDs 120 includes a first semiconductor layer 121, an emissive layer 122, a second semiconductor layer 123, a first pad electrode 121P, and a second pad electrode 123P.

The first semiconductor layer 121 is disposed on the substrate 110, and the second semiconductor layer 123 is disposed on the first semiconductor layer 121. The first semiconductor layer 121 and the second semiconductor layer 123 may be formed by implanting n-type or p-type impurities into gallium nitride (GaN). For example, the p-type impurities may be, but is not limited to, magnesium (Mg), zinc (Zn), beryllium (Be), etc. The n-type impurities may be, but is not limited to, silicon (Si), germanium (Ge), tin (Sn), etc. Therefore, the first semiconductor layer 121 may be an n-type semiconductor layer formed by implanting n-type impurities, and the second semiconductor layer 123 may be a p-type semiconductor layer formed by implanting p-type impurities. Alternatively, the first semiconductor layer 121 may be a p-type semiconductor layer formed by implanting p-type impurities, and the second semiconductor layer 123 may be an n-type semiconductor layer formed by implanting n-type impurities. In the following description, it is assumed that the first semiconductor layer 121 may be an n-type semiconductor layer formed by implanting n-type impurities into gallium nitride (GaN), and the second semiconductor layer 123 may be a p-type semiconductor layer formed by implanting p-type impurities into gallium nitride (GaN).

The emissive layer 122 is disposed between the first semiconductor layer 121 and the second semiconductor layer 123. The emissive layer 122 may receive holes and electrons from the first semiconductor layer 121 and the second semiconductor layer 123 to emit light. The emissive layer 122 may be made up of a single layer or a multi-quantum well (MQW) structure. For example, the emissive layer 122 may be made of, but is not limited to, indium gallium nitride (InGaN) or gallium nitride (GaN).

A part of the first semiconductor layer 121 protrudes outwardly from the emissive layer 122 and the second semiconductor layer 123. In other words, the emissive layer 122 and the second semiconductor layer 123 may be smaller than the first semiconductor layer 121 so that the upper surface of the first semiconductor layer 121 is exposed. The first semiconductor layer 121 may be exposed from the emissive layer 122 and the second semiconductor layer 123 in order to be electrically connected to the first pad electrode 121P to be described later.

The first passivation layer 111 is disposed to cover the first semiconductor layer 121, the emissive layer 122, and the second semiconductor layer 123. The first passivation layer 111 is an insulating layer for protecting the elements thereunder and preventing an electrical short-circuit between the first semiconductor layer 121 and the second semiconductor layer 123. Specifically, the first semiconductor layer 121 and the second semiconductor layer 123 may be electrically connected to different electrodes to supply electrons and holes to the emissive layer 122. If an electrode electrically connected to the first semiconductor layer 121 or the second semiconductor layer 123 is brought into contact with the second semiconductor layer 123 or the first semiconductor layer 121, an electrical short-circuit may occur. Accordingly, the first passivation layer 111 may be disposed as an insulating layer for insulating the first semiconductor layer 121 from the second semiconductor layer 123. For example, the first passivation layer 111 may be made up of, but is not limited to, a single layer of silicon oxide (SiOx) or silicon nitride (SiNx) or multiple layers thereof.

The first pad electrode 121P is disposed on the first passivation layer 111. The first pad electrode 121P may be electrically connected to the first semiconductor layer 121. Specifically, a contact hole may be formed in the first passivation layer 111, via which a portion of the upper surface of the first semiconductor layer 121 is exposed. Accordingly, the first pad electrode 121P may be in contact with the upper surface of the first semiconductor layer 121 through the contact hole so that the first pad electrode 121P may be electrically connected to the first semiconductor layer 121.

The second pad electrode 123P is disposed on the first passivation layer 111. The second pad electrode 123P may be electrically connected to the second semiconductor layer 123. Specifically, a contact hole may be formed in the first passivation layer 111, via which a portion of the upper surface of the second semiconductor layer 123 is exposed. Accordingly, the second pad electrode 123P may be in contact with the upper surface of the second semiconductor layer 123 through the contact hole so that the second pad electrode 123P may be electrically connected to the second semiconductor layer 123.

The first protective layer 115 is disposed on the plurality of LEDs 120 and the first passivation layer 111. The first protective layer 115 is a layer for protecting the plurality of LEDs 120 on the substrate 110. The first protective layer 115 may be made up of, but is not limited to, a single layer of transparent epoxy, silicon oxide (SiOx) or silicon nitride (SiNx) or multiple layers thereof.

The plurality of LEDs 120 may emit light of different colors or light of the same color. For example, when the LEDs 120 emit light of different colors, the LEDs 120 disposed in the red sub-pixels SPR may be LEDs emitting red light, the LEDs 120 disposed in the green sub-pixels SPG may be LEDs emitting green light, and the LEDs 120 disposed in the blue sub-pixels SPB may be LEDs emitting blue light. Since the LEDs 120 emits light of different colors, a light converting member such as the light-converting layers 161 may be eliminated.

If the LEDs 120 emit light of the same color, members for converting light, such as the light-converting layers 161 are disposed above the LEDs 120, respectively, to convert the light emitted from each of the LEDs 120 into a variety of colors. In the following description, it is assumed that all of the LEDs 120 emit light of blue. It is, however, to be understood that the present disclosure is not limited thereto.

A plurality of light-converting layers 161 and a plurality of light-blocking layers 162 are disposed on the first protective layer 115.

The light-converting layers 161 are disposed in the sub-pixels SPR, SPG and SPB, respectively. The light-converting layers 161 may be implemented by disposing a photo-acryl, silicon oxide SiOx or silicon nitride SiNx in which light-converting materials such as nano-phosphors, organic phosphors and quantum dots are distributed above the LEDs 120 by inkjet printing, dotting or the like. The light emitted from the LEDs 120 is irradiated onto the light-converting layers 161. The light-converting material of the light-converting layer 161 such as nano-phosphors, organic phosphors and quantum dots can absorb light so that light of a different wavelength exits.

For example, a red light-converting layer 161 may be disposed in the red sub-pixel SPR. The blue light emitted from the LEDs 120 may pass through the red light-converting layer 161 and may be converted into red light. A green light-converting layer 161 may be disposed in the green sub-pixel SPG. The blue light emitted from the LEDs 120 may pass through the green light-converting layer 161 and may be converted into green light. A blue light-converting layer 161 may be disposed in the blue sub-pixel SPB. When blue light is emitted from the LEDs 120, the blue light-converting layer 161 may be made of a transparent material such as photo acryl, silicon oxide (SiOx) and or silicon nitride (SiNx). The blue light emitted from the LEDs 120 may exit to the above of the substrate 110 as it is.

The plurality of light-blocking layers 162 is disposed between the light-converting layers 161. The light-blocking layers 162 may be disposed at boundaries between the sub-pixels SPR, SPG and SPB. The light-blocking layers 162 can block the light emitted from each of the LEDs 120 traveling toward other sub-pixels SPR, SPG and SPB to thereby suppress the color mixture of light. For example, the light-blocking layers 162 may be implemented as, but is not limited to, a black matrix or a reflective material.

Referring to FIGS. 3 and 4, a plurality of driving units each including a first semiconductor element 130, a second semiconductor element 140 and a capacitor 150, and a plurality of lines including gate lines GL, data lines DL, power lines PL and common lines CL are disposed on the lower surface of the substrate 110. The driving units are disposed in the sub-pixels SPR, SPG and SPB, respectively. The driving units of the sub-pixels SPR, SPG and SPB may drive the LEDs 120 of the sub-pixels SPR, SPG and SPB, respectively, to display images.

Each of the plurality of driving units includes the first semiconductor element 130, the second semiconductor element 140, and the capacitor 150. In order to drive the plurality of driving units, the gate lines GL, the data lines DL, the power lines PL, and the common lines CL are connected to the driving units.

A plurality of first semiconductor elements 130 and a plurality of second semiconductor elements 140 are disposed on the lower surface of the substrate 110. The plurality of first semiconductor elements 130 and the plurality of second semiconductor elements 140 may be used as driving elements of the display device 100. Each of the first semiconductor elements 130 and the second semiconductor elements 140 may be, but is not limited to, a thin-film transistor (TFT), an n-channel metal oxide semiconductor (NMOS), a p-channel metal oxide semiconductor (PMOS), a complementary metal oxide semiconductor (CMOS), a field effect transistor (FET), or the like. In the following description, among the field effect transistors, n-channel metal oxide semiconductors (NMOS) are employed as the first semiconductor elements 130 and the second semiconductor elements 140. It is, however, to be understood that the present disclosure is not limited thereto.

Each of the first semiconductor elements 130 includes a first gate electrode 131, a first source region 132, and a first drain region 133.

The first source region 132 and the first drain region 133 are spaced apart from each other and disposed on the lower surface of the substrate 110. The first source region 132 and the first drain region 133 may be formed by doping n-type or p-type impurities into the substrate 110. The substrate 110 may be a p-type substrate or an n-type substrate. For example, when the substrate 110 is a p-type substrate, the first source region 132 and the first drain region 133 may be formed by implanting n-type impurities such as arsenic and phosphorus. When the substrate 110 is an n-type substrate, the first source region 132 and the first drain region 133 may be formed by implanting p-type impurities such as boron. In the following description, the substrate 110 is a p-type substrate and is formed by implanting n-type impurities into the first source region 132 and the second drain region 133.

The gate insulating layer 112 is disposed between the first source region 132 and the first drain region 133. The gate insulating layer 112 is a layer for insulating the first source region 132 and the first drain region 133 from the first gate electrode 131 and may be made of an insulating material. For example, the gate insulating layer 112 may be made up of, but is not limited to, a single layer of silicon oxide (SiOx) or silicon nitride (SiNx) or multiple layers thereof.

The first gate electrode 131 is disposed on the gate insulating layer 112. The first gate electrode 131 may be electrically connected to the gate line GL. When gate voltage is applied from the gate line GL to the first gate electrode 131, the first semiconductor element 130 may be turned on. The first gate electrode 131 may be made of, but is not limited to, a conductive material such as poly silicon and molybdenum (Mo).

The second passivation layer 113 is disposed on the first semiconductor element 130. The second passivation layer 113 is a layer for protecting and insulating the elements thereunder and may be formed of an insulating material. For example, the second passivation layer 113 may be made up of, but is not limited to, a single layer of silicon oxide (SiOx) or silicon nitride (SiNx) or multiple layers thereof.

A first gate pad electrode 131P, a first source pad electrode 132P and a first drain pad electrode 133P are disposed on the second passivation layer 113. The first gate pad electrode 131P, the first source pad electrode 132P and the first drain pad electrode 133P may be electrically connected to the first gate electrode 131, the first source region 132 and the first drain region 133, respectively.

Initially, the first gate pad electrode 131P electrically connects the first gate electrode 131 with the gate line GL. The first gate pad electrode 131P may be integrated with the gate line GL and may be in contact with the first gate electrode 131. Specifically, a contact hole may be formed in the second passivation layer 113, via which the upper surface of the first gate electrode 131 is exposed. The first gate pad electrode 131P extended from the gate line GL to the first gate electrode 131 may be in contact with the upper surface of the first gate electrode 131 through the contact hole of the second passivation layer 113. Thus, the gate line GL and the first gate electrode 131 may be electrically connected with each other through the first gate pad electrode 131P.

The first source pad electrode 132P electrically connects the first source region 132 with the data line DL. Specifically, a contact hole may be formed in the second passivation layer 113, via which the second source region 132 is exposed. One end of the first source pad electrode 132P may be in contact with the first source region 132 through the contact hole of the second passivation layer 113. The other end of the first source pad electrode 132P may be extended toward the data line DL and may be electrically connected to the data line DL. Accordingly, the end of the first source pad electrode 132P is in contact with the first source region 132 and the other end thereof is in contact with the data line DL, so that the first source region 132 of the first semiconductor element 130 may be electrically connected to the data line DL.

The first drain pad electrode 133P may be electrically connected to the first drain region 133. Specifically, a contact hole may be formed in the second passivation layer 113, via which the first drain region 133 is exposed. One end of the first drain pad electrode 133P may be in contact with the first drain region 133 through the contact hole of the second passivation layer 113. Accordingly, the first drain pad electrode 133P may be electrically connected to the first drain region 133 through the contact hole of the second passivation layer 113.

A first capacitor electrode 151 extended from the first drain pad electrode 133P is disposed on the second passivation layer 113. The first capacitor electrode 151 is included in the capacitor 150 together with a dielectric layer 153 and a second capacitor electrode 152, which will be described later.

The first drain region 133 of the first semiconductor element 130 may be electrically connected to the second gate electrode 141 of the second semiconductor element 140 through the second gate pad electrode 141P to be described later, as well as the first drain pad electrode 133P and the first capacitor electrode 151. The first drain pad electrode 133P, the first capacitor electrode 151 and the second gate pad electrode 141P may be formed integrally. As the second gate pad electrode 141P formed integrally with the first drain pad electrode 133P comes in contact with the second gate electrode 141 of the second semiconductor element 140, the first drain region 133 of the first semiconductor element 130 may be electrically connected to the second gate electrode 141 of the second semiconductor element 140. Therefore, the first drain region 133 of the first semiconductor element 130 may be electrically connected to the second gate electrode 141 of the second semiconductor element 140 through the first drain pad electrode 133P, the first capacitor electrode 151 and the second gate pad electrode 141P formed integrally.

Each of the second semiconductor elements 140 includes a second gate electrode 141, a second source region 142, and a second drain region 143.

The second source region 142 and the second drain region 143 are spaced apart from each other and disposed on the lower surface of the substrate 110. Each of the second source region 142 and the second drain region 143 may be formed by doping n-type or p-type impurities into a p-type or an n-type substrate. The substrate 110 is a p-type substrate and is formed by implanting n-type impurities into the second source region 142 and the second drain region 143, like the first source region 132 and the first drain region 133 of the first semiconductor element 130. It is, however, to be understood that the present disclosure is not limited thereto.

The gate insulating layer 112 is disposed between the second source region 142 and the second drain region 143, and the second gate electrode 141 is disposed on the gate insulating layer 112. The second gate electrode 141 may be made of, but is not limited to, a conductive material such as poly silicon and molybdenum (Mo).

The second gate electrode 141 is electrically connected to the first drain region 133 of the first semiconductor element 130. Specifically, the second gate electrode 141 may be electrically connected to the first drain region 133 of the first semiconductor element 130 through the second gate pad electrode 141P, the first capacitor electrode 151 and the first drain pad electrode 133P. The first semiconductor element 130 may transfer the data voltage to the second semiconductor element 140 electrically connected thereto through the first drain region 133 to thereby control the second element so that it is turned on or off.

The second passivation layer 113 is disposed on the second semiconductor element 140, and the second gate pad electrode 141P, the second source pad electrode 142P and the second drain pad electrode 143P are disposed on the second passivation layer 113. The second gate pad electrode 141P, the second source pad electrode 142P and the second drain pad electrode 143P may be electrically connected to the second gate electrode 141, the second source region 142 and the second drain region 143, respectively.

The second gate pad electrode 141P electrically connects the second gate electrode 141 with the first drain region 133 of the first semiconductor element 130. Specifically, a contact hole may be formed in the second passivation layer 113, via which a part of the upper surface of the second gate electrode 141 is exposed. The second gate pad electrode 141P, which is formed integrally with the first drain pad electrode 133P and the first capacitor electrode 151 and extended toward the second gate electrode 141, may be in contact with the upper surface of the second gate electrode 141 through the contact hole of the second passivation layer 113. Accordingly, the second gate electrode 141 may be electrically connected to the first drain region 133 through the second gate pad electrode 141P, the first capacitor electrode 151 and the first drain pad electrode 133P.

The gate line GL and the power line PL are disposed on the second passivation layer 113.

The gate line GL transfers the gate voltage to the driving unit of each of the sub-pixels SPR, SPG and SPB. Specifically, the gate line GL transfers the gate voltage to the first gate electrode 131 of the first semiconductor element 130. The gate line GL may be extended from the active area A/A to the non-active area N/A and may receive the gate voltage from the gate driver IC disposed in the non-active area N/A to transfer the gate voltage to the first gate electrode 131 of the driving unit.

The power line PL transfers the supply voltage to the driving unit of each of the sub-pixels SPR, SPG and SPB. Specifically, the power line PL transfers the supply voltage to the second pad electrode 123P of each of the LEDs 120. The power line PL may be extended from the active area A/A to the non-active area N/A and may receive the supply voltage from the driver IC disposed in the non-active area N/A to transfer the supply voltage to the LEDs 120.

The third passivation layer 114 is disposed on the gate line GL, the power line PL, the first gate pad electrode 131P, the first source pad electrode 132P, the first drain pad electrode 133P, the second gate pad electrode 141P, the second source pad electrode 142P, the second drain pad electrode 143P and the first capacitor electrode 151. The third passivation layer 114 is a layer for protecting and insulating the elements thereunder and may be formed of an insulating material. For example, the third passivation layer 114 may be made up of, but is not limited to, a single layer of silicon oxide (SiOx) or silicon nitride (SiNx) or multiple layers thereof.

The data line DL and the common line CL are disposed on the third passivation layer 114.

The data line DL transfers the data voltage to the driving unit of each of the sub-pixels SPR, SPG and SPB. Specifically, the data line DL transfers the data voltage to the first source region 132 of the first semiconductor element 130. The data line DL may be extended from the active area A/A to the non-active area N/A and may receive the data voltage from the data driver IC disposed in the non-active area N/A to transfer the data voltage to the driving unit.

The common line CL transfers a common voltage to the driving unit of each of the sub-pixels SPR, SPG and SPB. Specifically, the common line CL may be extended from the active area A/A to the non-active area N/A and may receive the common voltage from the driver IC disposed in the non-active area N/A to transfer the common voltage to the capacitor 150 and the second semiconductor element 140.

The second capacitor electrode 152 is disposed on the third passivation layer 114 to overlap the first capacitor electrode 151. The dielectric layer 153 is disposed between the first capacitor electrode 151 and the second capacitor electrode 152. Specifically, the first capacitor electrode 151 and the second capacitor electrode 152 may overlap each other with the dielectric layer 153 interposed therebetween to form the capacitor 150. The capacitor 150 may store the data voltage so that the LED 120 remains in the same state until the next gate voltage is applied to the gate line GL.

A contact hole may be formed in the third passivation layer 114, via which the first capacitor electrode 151 is exposed. In addition, the dielectric layer 153 may be disposed so that the contact hole of the third passivation layer 114 is filled with it. The dielectric layer 153 can insulate the first capacitor electrode 151 from the second capacitor electrode 152 and can improve the capacitance of the capacitor 150. Specifically, since the dielectric constant of the dielectric layer 153 may be proportional to the capacitance of the capacitor 150, the dielectric layer 153 may be made of a material having a high dielectric constant to improve the capacitance of the capacitor 150. It is, however, to be understood that the dielectric layer 153 may be eliminated. On the behalf of the dielectric layer 153, the third passivation layer 114 may insulate the first capacitor electrode 151 from the second capacitor electrode 152 and may serve as the dielectric layer 153 to form the capacitor 150.

The second capacitor electrode 152 is disposed on the dielectric layer 153 to overlap with the first capacitor electrode 151. The second capacitor electrode 152 may be electrically connected to the common line CL. For example, the second capacitor electrode 152 may be extended from the common line CL toward the first capacitor electrode 151, and the second capacitor electrode 152 and the common line CL may be formed integrally.

The second capacitor electrode 152 may be extended toward the second source region 142 of the second semiconductor device 140 and may be electrically connected to the second source region 142. Specifically, the second capacitor electrode 152 may be extended toward the second source region 142 and may be in contact with the second source pad electrode 142P electrically connected to the second source region 142. Accordingly, the second capacitor electrode 152 integrated with the common line CL may be electrically connected to the second source region 142 of the second semiconductor element 140 through the second source pad electrode 142P.

The second protective layer 116 is disposed on the second capacitor electrode 152, the common line CL, and the data line DL. The second protective layer 116 is for protecting the first semiconductor elements 130, the second semiconductor elements 140, the capacitors 150, the gate lines GL, the data lines DL, the common lines CL and the power lines PL on the lower surface of the substrate 110. The second protective layer 116 may be made up of, but is not limited to, a single layer of transparent epoxy, silicon oxide (SiOx) or silicon nitride (SiNx) or multiple layers thereof.

A plurality of connection units CP is disposed in via holes VH penetrating through the substrate 110, respectively. The connection units CP electrically connect the LEDs 120 on the substrate 110 with the driving units and the lines under the substrate 110.

The connection units CP include a plurality of first connection units CP1 and a plurality of second connection units CP2. The first connection units CP1 electrically connect the LEDs 120 with the second semiconductor elements 140. The second connection units CP2 electrically connect the LEDs 120 with the power lines PL.

More specifically, one end of each of the first connection units CP1 may be in contact with the first pad electrode 121P of the respective LEDs 120, while the other end of each of the first connection units CP1 may be in contact with the second drain pad electrode 143P of the respective driving units. One end of each of the second connection units CP2 may be in contact with the second pad electrode 123P of the respective LEDs 120, while the other end of each of the second connection units CP2 may be in contact with the power lines PL.

Accordingly, the voltage is applied to the first semiconductor layer 121 of the LEDs 120 through the first connection units CP1, and the voltage is applied to the second semiconductor layer 123 of the LEDs 120 through the second connection units CP2, so that light can be emitted from the LEDs 120.

Although each of the plurality of driving units includes the first semiconductor element 130, the second semiconductor element 140 and the capacitor 150 in the example shown in FIGS. 3 and 4, the numbers of the semiconductor elements and the capacitor in each of the driving units is not limited thereto. Each of the driving units may include three semiconductor elements and one capacitor or four semiconductor elements and one capacitor, and so on.

In addition, although the lines connected to each of the plurality of driving units may include the gate lines GL, the data lines DL, the power lines PL and the common lines CL in the example shown in FIGS. 3 and 4, the present disclosure is not limited thereto. The numbers and arrangement of the lines may vary depending on the numbers and arrangement of the semiconductor elements and capacitors in each of the driving units.

In the display device 100 according to the exemplary aspect of the present disclosure, by disposing the LEDs 120 on the upper surface of the substrate 110 while disposing the plurality of driving units each including the first semiconductor element 130, the second semiconductor element 140 and the capacitor 150 and the plurality of lines including the gate lines GL, the data lines DL, the power lines PL and the common lines CL on the lower surface of the substrate 110, it is possible to increase the emission area of the LEDs 120. Previously, a plurality of LEDs, a plurality of driving units and a plurality of lines are disposed on one surface of the substrate, thereby displaying images on the surface of the substrate. In contrast, in the display device 100 according to the exemplary aspect of the present disclosure, the LEDs 120 are disposed on the surface of the substrate 110 different from the substrate 110 where the plurality of driving units each including the first semiconductor element 130, the second semiconductor element 140 and the capacitor 150 and the plurality of lines including the gate lines GL, the data lines DL, the power lines PL and the common lines CL are disposed, so that the area where the LEDs 120 are disposed can be increased. More specifically, as only the LEDs 120 are disposed on the upper surface of the substrate 110, more LEDs 120 can be disposed than in an existing display device in which a plurality of LEDs, a plurality of driving units and a plurality of lines are disposed on the upper surface of the substrate together with the LEDs. Accordingly, in the display device 100 according to the exemplary aspect of the present disclosure, more LEDs 120 can be disposed on a surface of the substrate 110, and the display device 100 having a higher PPI (pixel per inch) can be implemented. In addition, as the emission area of the LEDs 120 is increased, the luminance and efficiency of the display device 100 can be improved.

In the display device 100 according to the exemplary aspect of the present disclosure, by disposing the plurality of driving units each including the first semiconductor element 130, the second semiconductor element 140 and the capacitor 150 on the lower surface of the substrate 110, and the plurality of lines including the gate lines GL, the data lines DL, the power lines PL and the common lines CL on the lower surface of the substrate 110, it is possible to reduce the non-active area N/A on the upper surface of the substrate 110. Specifically, the plurality of lines may receive voltages from the driver IC and the like and transmit the voltages to the plurality of driving units. One end of each of the plurality of lines may be connected to the driver IC disposed in the non-active area N/A to receive a voltage. For a high-resolution display device, the numbers of the LEDs and the driving units are increased, as well as the number of the plurality of lines. Accordingly, a larger non-active area N/A is required in order to apply voltages to the lines, respectively. In contrast, in the display device 100 according to the exemplary aspect of the present disclosure, the plurality of lines and the plurality of driving units may be disposed on the lower surface of the substrate 110, instead of the upper surface of the substrate 110 where the LEDs 120 are disposed to implement the active area A/A. In this manner, it is possible to provide the display device 100 in which the active area A/A where images are displayed on the upper surface of the substrate 110 can be increased while the non-active area N/A where no image is displayed can be reduced.

Hereinafter, the display device 100 according to the exemplary aspect of the present disclosure and a method of fabricating the display device 100 will be described in detail with reference to FIGS. 5A to 5K.

Figure 5A:
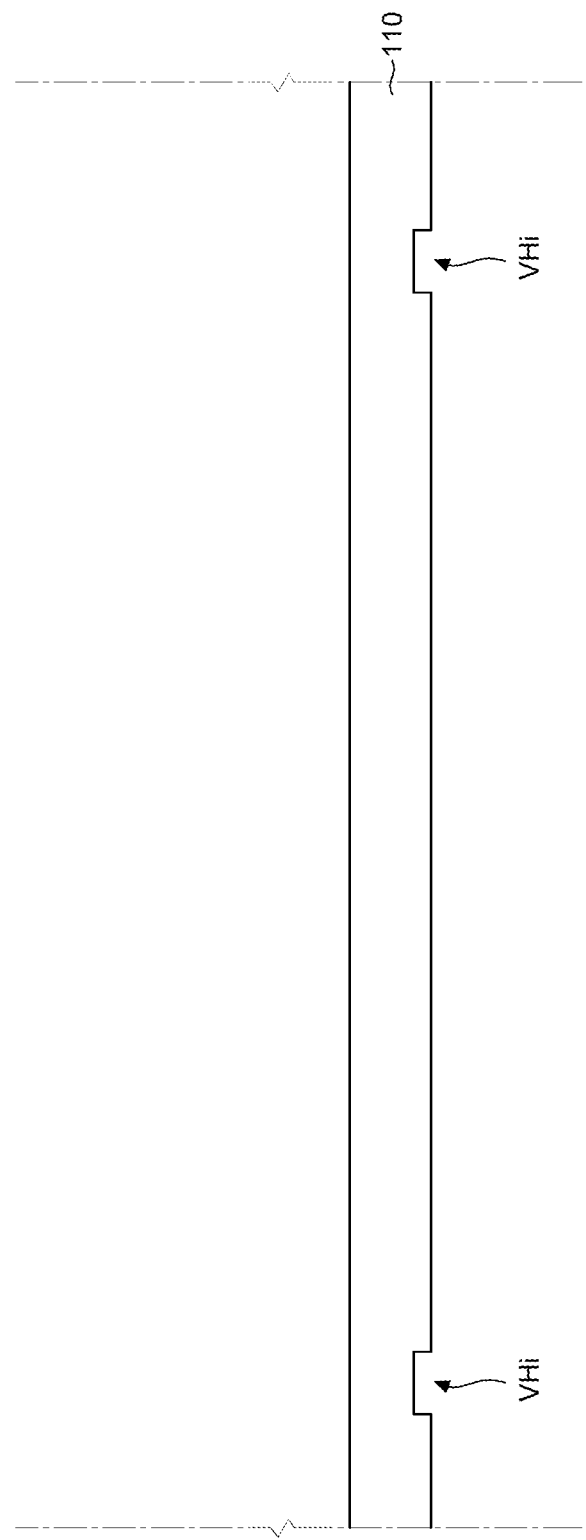
FIGS. 5A to 5K are schematic cross-sectional views for illustrating processing steps of a method of fabricating a display device according to an exemplary aspect of the present disclosure.
Figure 5B:
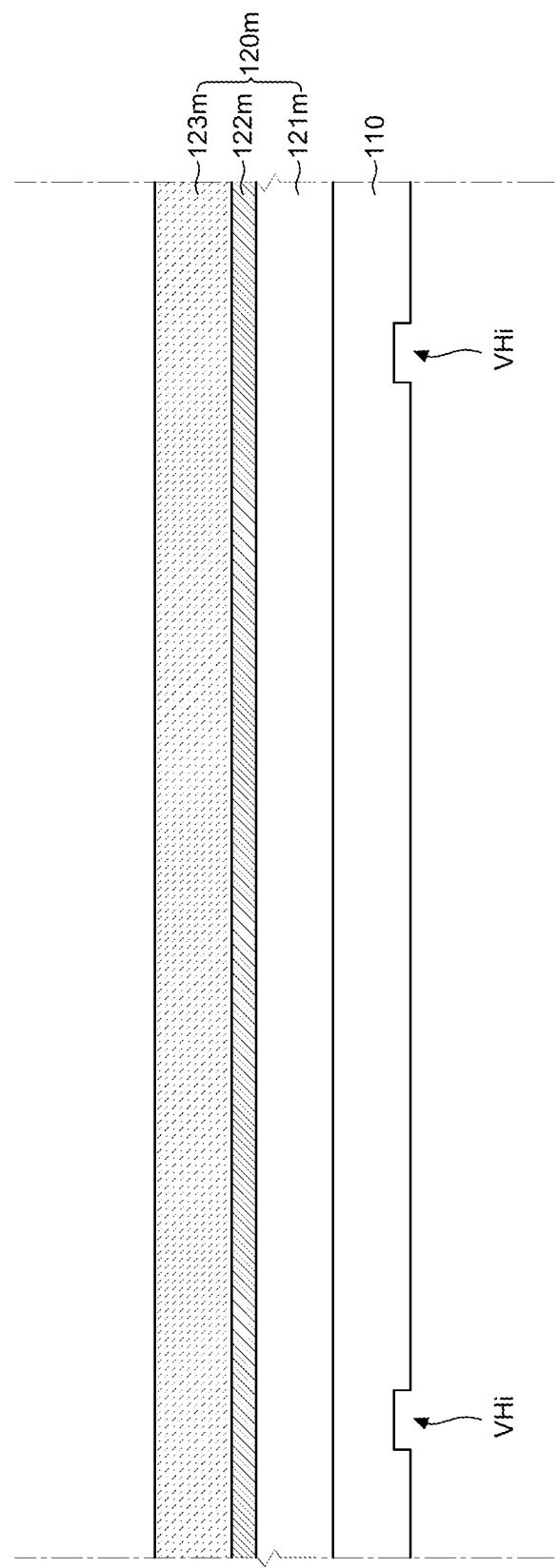
Figure 5C:
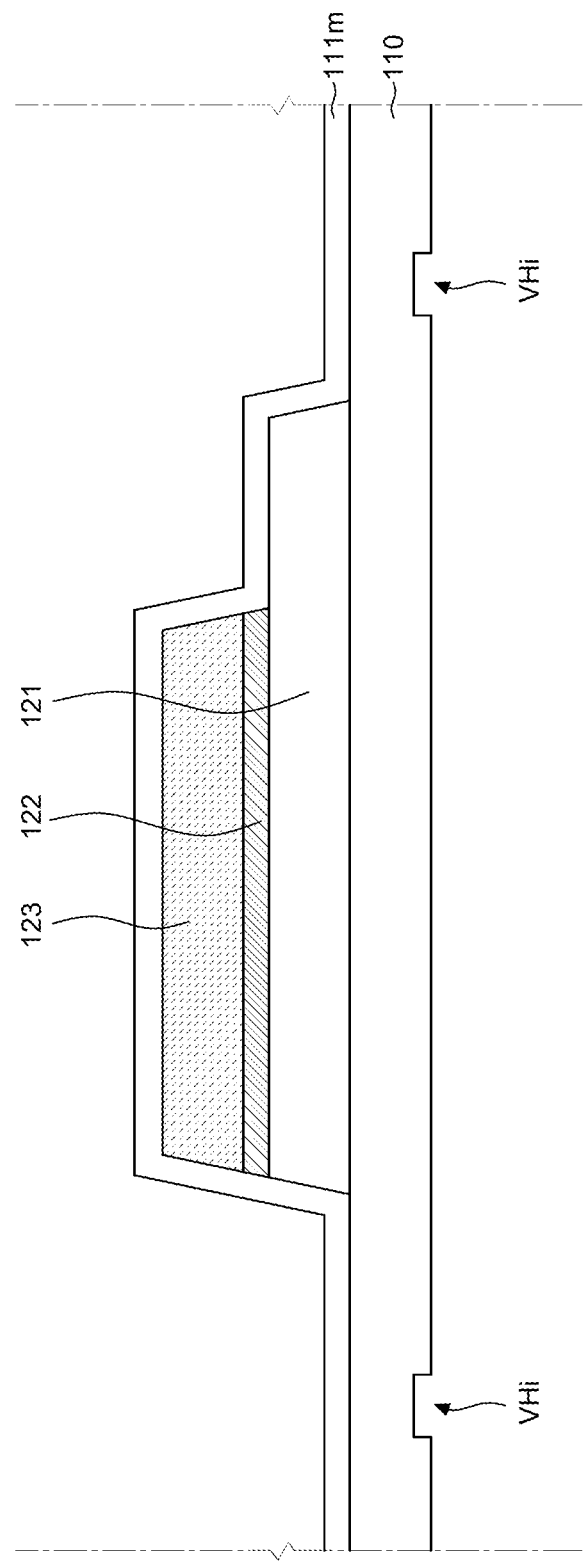
Figure 5D:
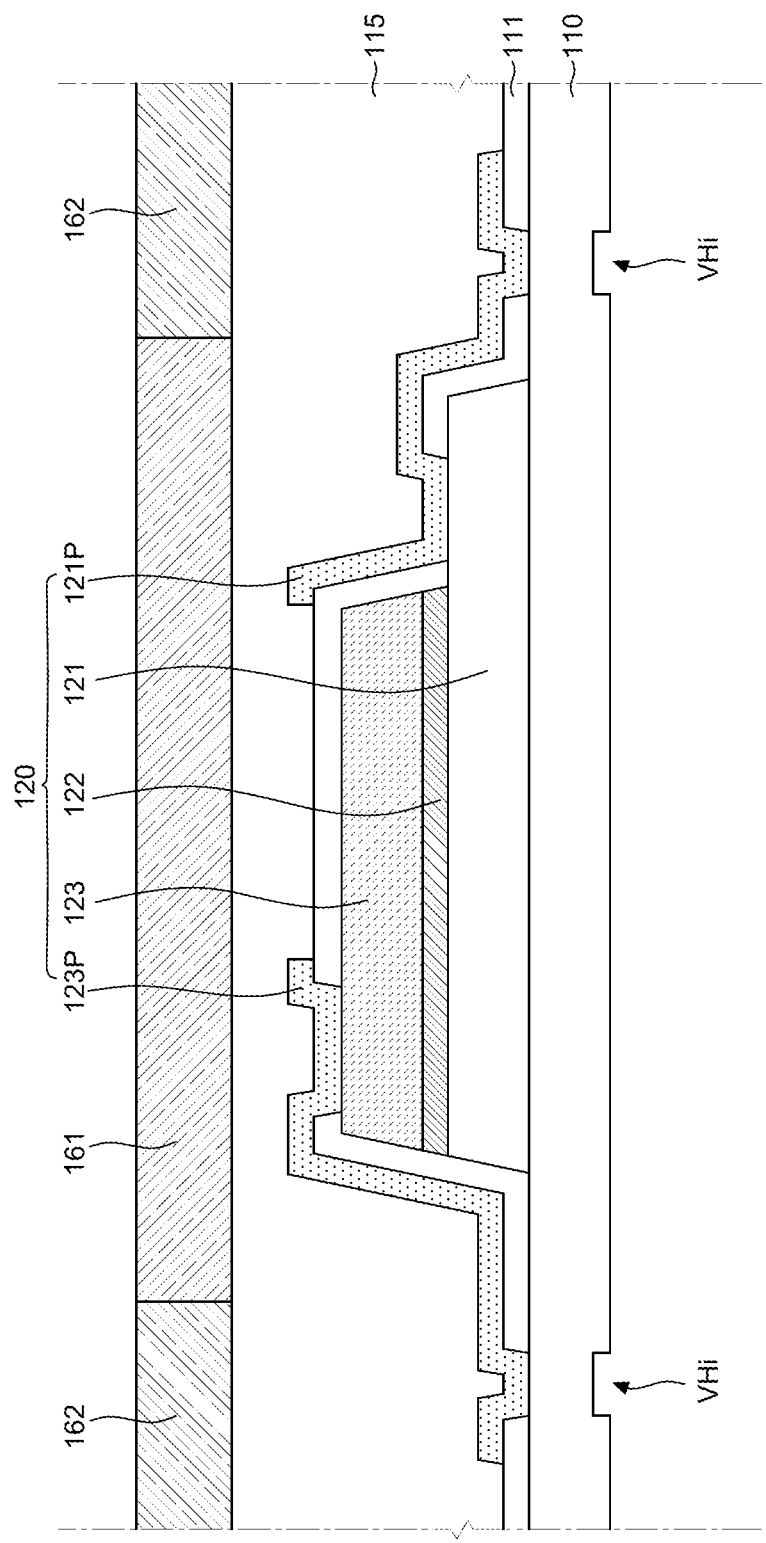
Figure 5E:
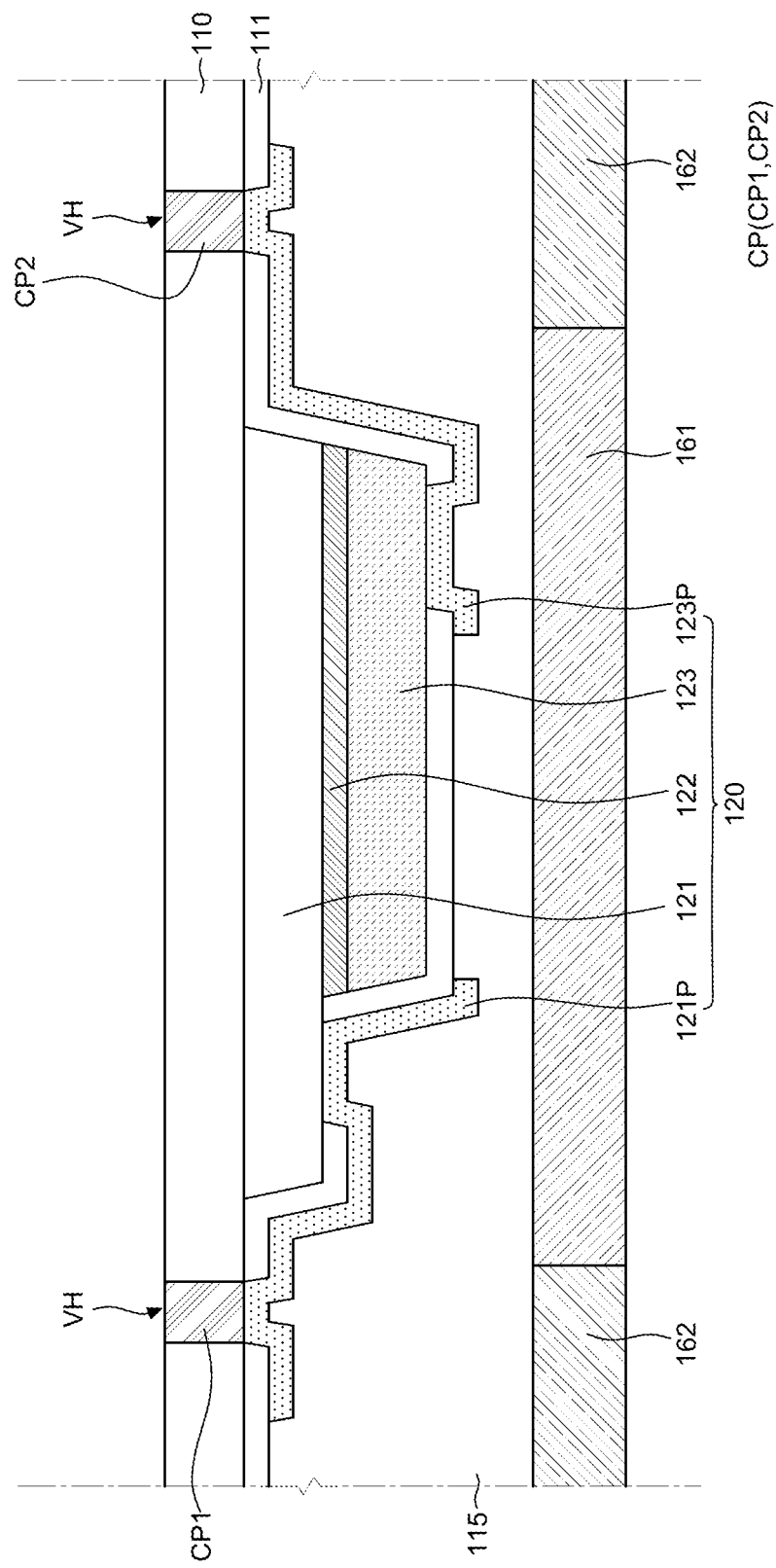

FIGS. 5A to 5K are schematic cross-sectional views for illustrating processing steps of a method of fabricating a display device according to an exemplary aspect of the present disclosure. Specifically, FIGS. 5A to 5D are schematic cross-sectional views for illustrating processing steps of forming a plurality of LEDs 120 on the upper surface of the substrate 110. FIG. 5E is a schematic cross-sectional view for illustrating a process of forming a plurality of connection units CP. FIGS. 5F to 5K are schematic cross-sectional views for illustrating processing steps of forming a plurality of driving units and a plurality of lines on the lower surface of the substrate 110.

Referring to FIG. 5A, a plurality of grooves VHi is formed in the lower surface of the substrate 110. The grooves VHi are formed in line with the first pad electrode 121P and the second pad electrode 123P of each of the plurality of LEDs 120. The grooves VHi may be processed into a plurality of via holes VH where the connection units CP are to be formed during a subsequent process, which will be described later with reference to FIG. 5E.

Referring to FIG. 5B, an epitaxial layer 120m is formed on the entire upper surface of the substrate 110 having the plurality of grooves VHi formed therein.

The epitaxial layer 120m is for forming the plurality of LEDs 120 and may have a structure in which a material for forming a first semiconductor layer 121, a material for forming an emissive layer 122 and a material for forming a second semiconductor layer 123, which form the LEDs 140, are stacked on one another sequentially. For example, the epitaxial layer 120m may include a first semiconductor material layer 121m, a light-emitting material layer 122m, and a second semiconductor material layer 123m.

Specifically, the first semiconductor material layer 121m is formed throughout the surface of the substrate 110. The first semiconductor material layer 121m may be made of gallium nitride doped with, e.g., n-type impurities, as the material for forming the first semiconductor layer 120 of the LEDs 121.

Subsequently, the light-emitting material layer 122m is formed on the first semiconductor material layer 121m. The light-emitting material layer 122m may be made of, e.g., indium gallium nitride, gallium nitride, or the like, as the material for forming the emissive layer 122 of the LEDs 120.

Lastly, the second semiconductor material layer 123m is formed on the light-emitting material layer 122m. The second semiconductor material layer 123m may be made of gallium nitride doped with, e.g., p-type impurities, as the material for forming the second semiconductor layer 123 of the LEDs 120.

The first semiconductor material layer 121m, the light-emitting material layer 122m, and the second semiconductor material layer 123m of the epitaxial layer 120m may be formed on the substrate 110 by, but is not limited to, metal organic chemical vapor deposition (MOCVD) or sputtering.

Referring to FIG. 5C, the epitaxial layer 120m is etched, such that the first semiconductor layer 121, the emissive layer 122, and the second semiconductor layer 123 of the plurality of LEDs 120 are formed. Then, a first passivation material 111m is formed on the second semiconductor layer 123.

Initially, the second semiconductor material layer 123m formed at the top of the epitaxial layer 120m may be etched. For example, the second semiconductor material layer 123m may be etched, leaving the part of the second semiconductor material layer 123m that overlaps with the second semiconductor layer 123 of the LED 120. As a result, the second semiconductor layer 123 made of the second semiconductor material layer 123m can be formed.

After the second semiconductor material layer 123m is etched, the light-emitting material layer 122m may be etched. For example, the light-emitting material layer 122m may be etched, leaving the part of the light-emitting material layer 122m that overlaps with the second semiconductor material layer 123m.

After the second semiconductor material layer 123m and the light-emitting material layer 122m have been etched, a part of the first semiconductor material layer 121m that is exposed from the second semiconductor material layer 123m and the light-emitting material layer 122m may be etched selectively. For example, the first semiconductor material layer 121m may be etched, leaving the part of the first semiconductor material layer 121m that overlaps with the first semiconductor layer 121. As a result, the second semiconductor layer 123 made of the second semiconductor material layer 123m, the emissive layer 122 made of the light-emitting material layer 122m, and the first semiconductor layer 121 made of the first semiconductor material layer 121m may be formed.

Lastly, the first passivation material layer 111m may be formed to cover the first semiconductor layer 121, the emissive layer 122 and the second semiconductor layer 123.

Referring to FIG. 5D, the first pad electrode 121P and the second pad electrode 123P are formed on the first passivation layer 111. Then, the first protective layer 115, a plurality of light-blocking layers 162 and a plurality of light-converting layers 161 are formed over the LEDs 120.

Initially, the first passivation material layer 111m covering the first semiconductor layer 121, the emissive layer 122 and the second semiconductor layer 123 may be etched, such that contact holes may be formed. For example, in order to form a contact hole for connecting the first semiconductor layer 121 with the first pad electrode 121P, a part of the first passivation material layer 111m covering the upper surface of the first semiconductor layer 121 may be etched.

In addition, in order to form a contact hole for connecting the second semiconductor layer 123 with the second pad electrode 123P, a part of the first passivation material layer 111m covering the upper surface of the second semiconductor layer 123 may be etched.

In order to form contact holes for connecting the first pad electrode 121P and the second pad electrode 123P with a plurality of connection units CP to be formed in a subsequent process, parts of the first passivation material layer 111m that overlap with the plurality of grooves VHi may be etched.

Accordingly, the parts of the first passivation material layer 111m may be etched that overlap with the upper surface of the first semiconductor layer 121, the upper surface of the second semiconductor layer 123 and the plurality of grooves VHi, to form the first passivation layer 111.

Subsequently, the first pad electrode 121P and the second pad electrode 123P may be formed on the first passivation layer 111 exposing a part of each of the first semiconductor layer 121 and the second semiconductor layer 123. Specifically, a conductive material layer is formed on the first passivation layer 111, and the conductive material layer is etched to form the first pad electrode 121P and the second pad electrode 123P. As the first pad electrode 121P and the second pad electrode 123P are formed, the LEDs 120 are completed.

One end of the first pad electrode 121P may be in contact with the first semiconductor layer 121, and the other end of the first pad electrode 121P may be overlap with the plurality of grooves VHi. One end of the second pad electrode 123P may be in contact with the second semiconductor layer 123, and the other end of the second pad electrode 123P may be overlap with the plurality of grooves VHi.

A plurality of connection units CP may be formed where the grooves VHi are formed. To electrically connect the LEDs 120 with the plurality of driving units and the plurality of power lines PL, the positions of the first pad electrode 121P and the second pad electrode 123P have to be in line with the grooves VHi. However, since the grooves VHi are not seen from the upper surface of the substrate 110 on which the LEDs 120 are formed, it is necessary to align the positions of the grooves VHi with the position of the LEDs 120. To this end, alignment holes AH for determining the positions of the grooves VHi and the LEDs 120 are formed, which will be described later with reference to FIGS. 6A to 6E.

Subsequently, the first protective layer 115 may be formed over the first pad electrode 121P and the second pad electrode 123P. The first protective layer 115 may be formed to cover the entire upper surface of the substrate 110 on which the LEDs 120 are formed.

Subsequently, the plurality of light-blocking layers 162 may be formed on the first protective layer 115. The light-blocking layers 162 may be formed such that they do not overlap the LEDs 120. The light-blocking layers 162 may be formed at the boundaries between the sub-pixels SPR, SPG and SPB. Specifically, a material for forming the light-blocking layer 162 is formed on the first protective layer 115. Then, the part of the material for the light-blocking layer 162 that overlaps with the LED 120, especially with the emissive layer 122 of the LED 120 is etched, so that the light-blocking layer 162 can be formed.

Subsequently, the plurality of light-converting layers 161 may be formed on the first protective layer 115. The light-converting layers 161 may be formed such that they overlap the LEDs 120. The light-converting layers 161 may be formed in the sub-pixels SPR, SPG and SPB, respectively. For example, a red light-converting layer 161 may be formed in the red sub-pixel SPR. A green light-converting layer 161 may be formed in the green sub-pixel SPG. A blue light-converting layer 161 may be formed in the blue sub-pixel SPB.

Referring to FIG. 5E, a plurality of via holes VH and a plurality of connection units CP are formed in the substrate 110 on which the LEDs 120 are formed.

Initially, the substrate 110 on which the LEDs 120 have been formed is turned upside down, and the plurality of via holes VH may be formed from the plurality of grooves VHi formed in the lower surface of the substrate 110. The grooves VHi may be formed in line with the first pad electrode 121P and the second pad electrode 123P of the LED 120, respectively. The plurality of via holes VH formed from the plurality of grooves VHi may expose the first pad electrode 121P and the second pad electrode 123P of each of the plurality of LEDs 120 on the lower surface of the substrate 110.

Subsequently, the plurality of connection units CP may be formed in the via holes VH, respectively. Specifically, the connection units CP may be formed by filling the via holes VH with a conductive material. Accordingly, a first connection unit CP1 may be in contact with the first pad electrode 121P of each of the LEDs 120, and a second connection unit CP2 may be in contact with the second pad electrode 123P of each of the LEDs 120.

Figure 5F:
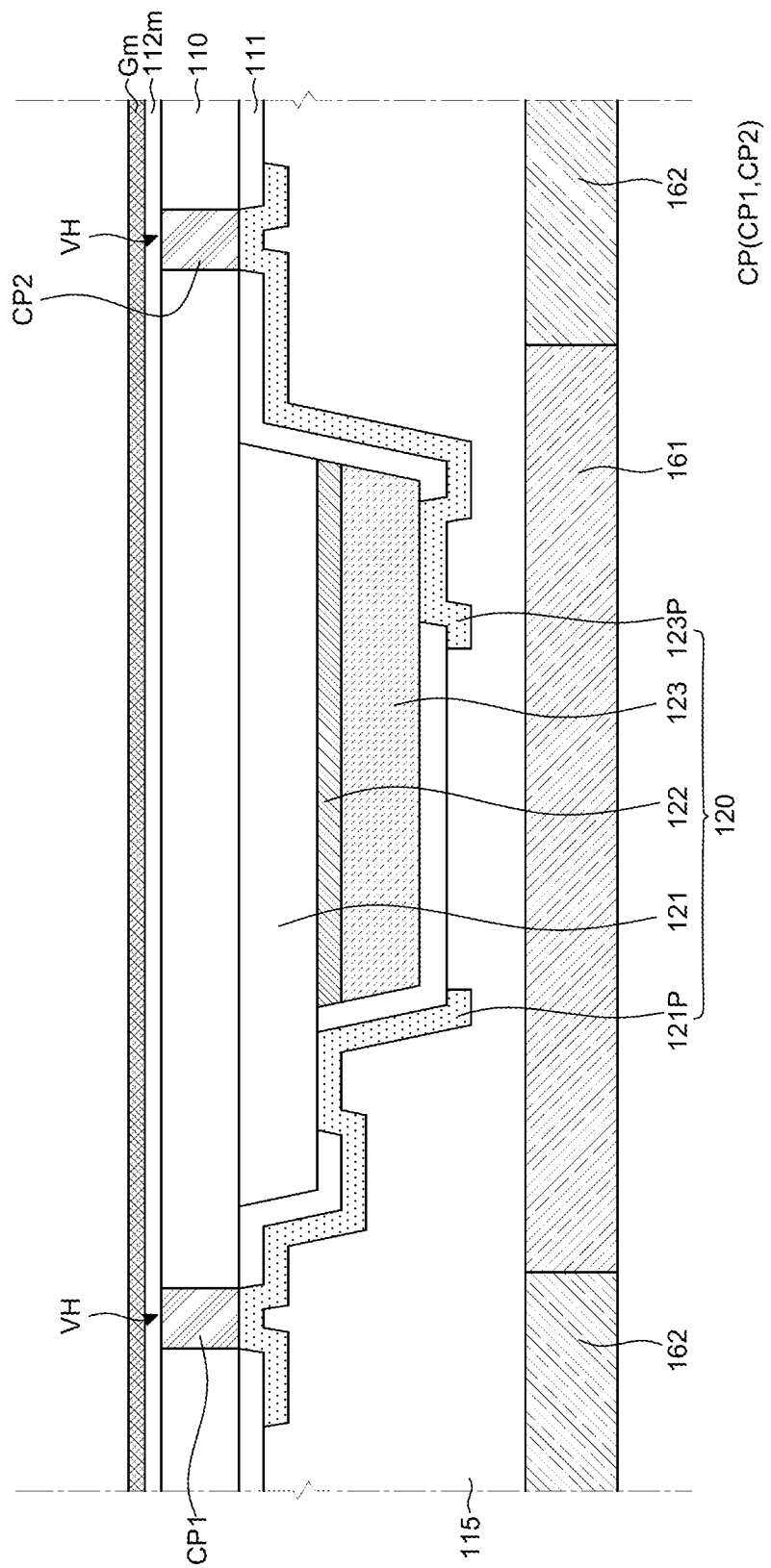

Referring to FIG. 5F, a gate insulating material layer 112m and a gate electrode material layer Gm are formed on the lower surface of the substrate 110 in which the plurality of connection units CP are formed.

Specifically, the gate insulating material layer 112m may be formed on the lower surface of the substrate 110 on which the connection units CP are formed. The gate insulating material layer 112m is for forming the gate insulating layer 112 and may be made up of a single layer of, for example, silicon oxide (SiOx) or silicon nitride (SiNx) or multiple layers thereof. It is, however, to be understood that the present disclosure is not limited thereto.

Subsequently, the gate electrode material layer Gm is formed on the gate insulating material layer 112m. The gate electrode material layer Gm is a material that forms the first gate electrode 131 of the first semiconductor elements 130 and the second gate electrode 141 of the second semiconductor elements 140, and may include, for example, a conductive material such as poly silicon and molybdenum (Mo). It is, however, to be understood that the present disclosure is not limited thereto.

Figure 5G:
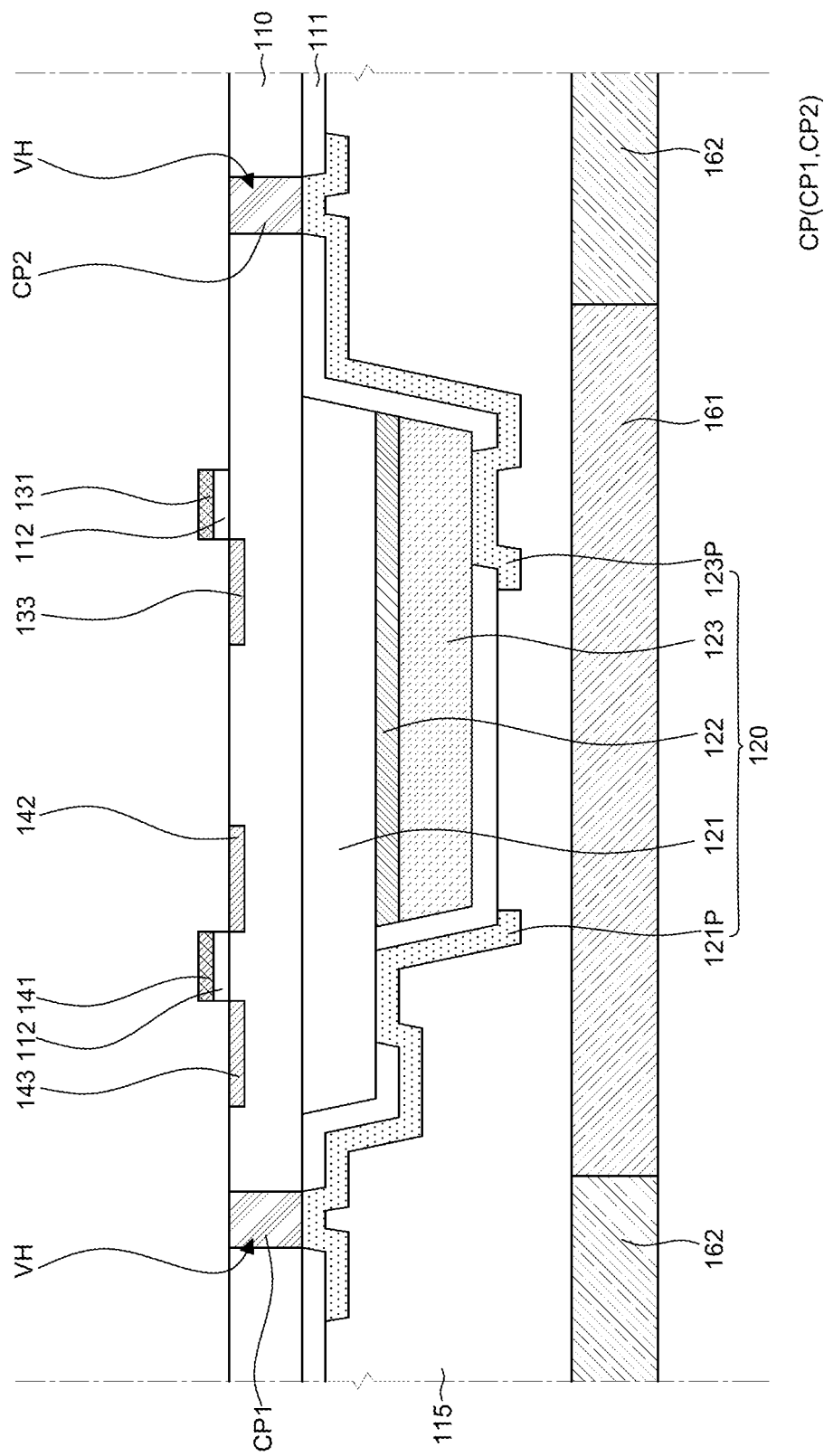

Referring to FIG. 5G, the gate electrode material layer Gm and the gate insulating material layer 112m are etched to form the first gate electrode 131, the second gate electrode 141 and the gate insulating layer 112, and a first source region 132, a first drain region 133, a second source region 142 and a second drain region 143 are formed.

Initially, the gate electrode material layer Gm may be etched so that the first gate electrode 131 and the second gate electrode 141 may be formed.

Subsequently, parts of the gate insulating material layer 112m that do not overlap with the first gate electrode 131 and the second gate electrode 141 are etched, so that the gate insulating layer 112 may be formed. That is to say, the gate insulating material layer 112m is etched, leaving the parts under the first gate electrode 131 and the second gate electrode 141, so that the gate insulating layer 112 can be formed.

Subsequently, the first source region 132, the first drain region 133, the second source region 142 and the second drain region 143 may be formed. Specifically, a photoresist may be formed such that it does not overlap the first source region 132, the first drain region 133, the second source region 142, and the second drain region 143. Then, n-type or p-type impurities may be implanted into the first source region 132, the first drain region 133, the second source region 142 and the second drain region 143 exposed from the photoresist. Lastly, an annealing process may be carried out for electrical activation after the implantation of the n-type or p-type impurities. Accordingly, n-type or p-type impurities may be implanted into the first source region 132, the first drain region 133, the second source region 142 and the second drain region 143 by using forming the photoresist.

In this manner, the first semiconductor element 130 having the first gate electrode 131, the first source region 132 and the first drain region 133 and the second semiconductor elements 140 having the second gate electrode 141, the second source region 142 and the second drain region 143 can be formed.

Figure 5H:
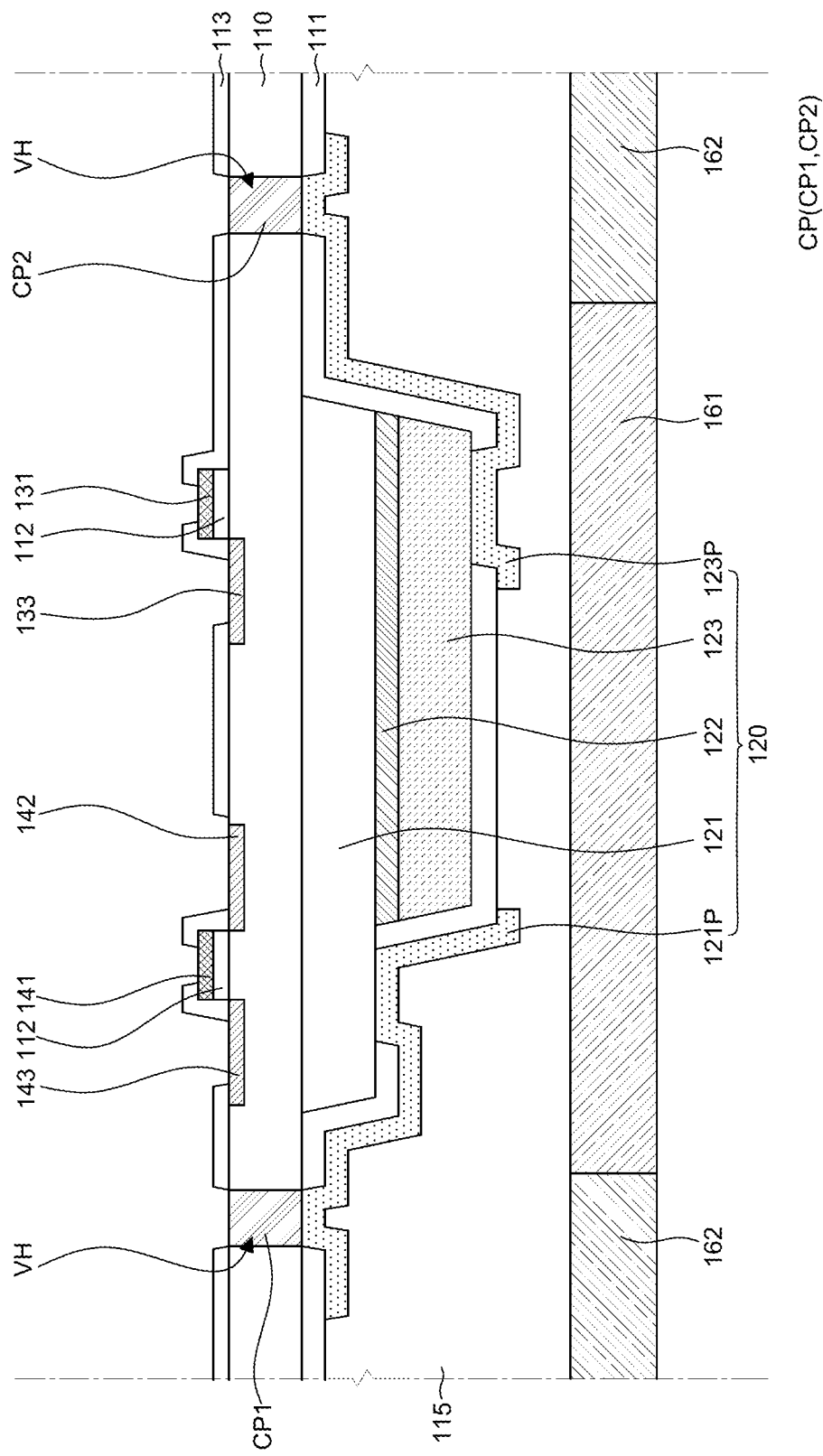

Referring to FIG. 5H, a second passivation layer 113 is formed on the first semiconductor element 130 and the second semiconductor element 140.

A second passivation material layer may be formed to cover the first semiconductor element 130 and the second semiconductor element 140.

Subsequently, the second passivation material layer covering the first semiconductor element 130 and the second semiconductor element 140 is etched, so that contact holes may be formed. For example, to form a contact hole for connecting the first gate electrode 131 with the first gate pad electrode 131P, a part of the second passivation material layer covering the upper surface of the first gate electrode 131 may be etched.

To form contact holes for connecting the first source region 132 and the first drain region 133 with the first source pad electrode 132P and the first drain pad electrode 133P, respectively, a part of the second passivation material layer covering the first source region 132 and the first drain region 133 may be etched.

To form a contact hole for connecting the second gate electrode 141 with the second gate pad electrode 141P, a part of the second passivation material layer covering the upper surface of the second gate electrode 141 may be etched.

To form contact holes for connecting the second source region 142 and the second drain region 143 with the second source pad electrode 142P and the second drain pad electrode 143P, respectively, a part of the second passivation material layer covering the second source region 142 and the second drain region 143 may be etched.

Lastly, to form contact holes for connecting the power line PL and the second drain region 143 of the second semiconductor element 140 with the plurality of connection units CP, the second passivation material layer cover the connection units CP may be etched.

Therefore, the parts of the second passivation material layer are etched that overlap with the first gate electrode 131, the first source region 132 and the first drain region 133 of each of the plurality of first semiconductor elements 130, and with the second gate electrode 141, the second source region 142 and the second drain region 143 of each of the plurality of second semiconductor elements 140, such that the second passivation layer 113 can be formed.

Figure 5I:
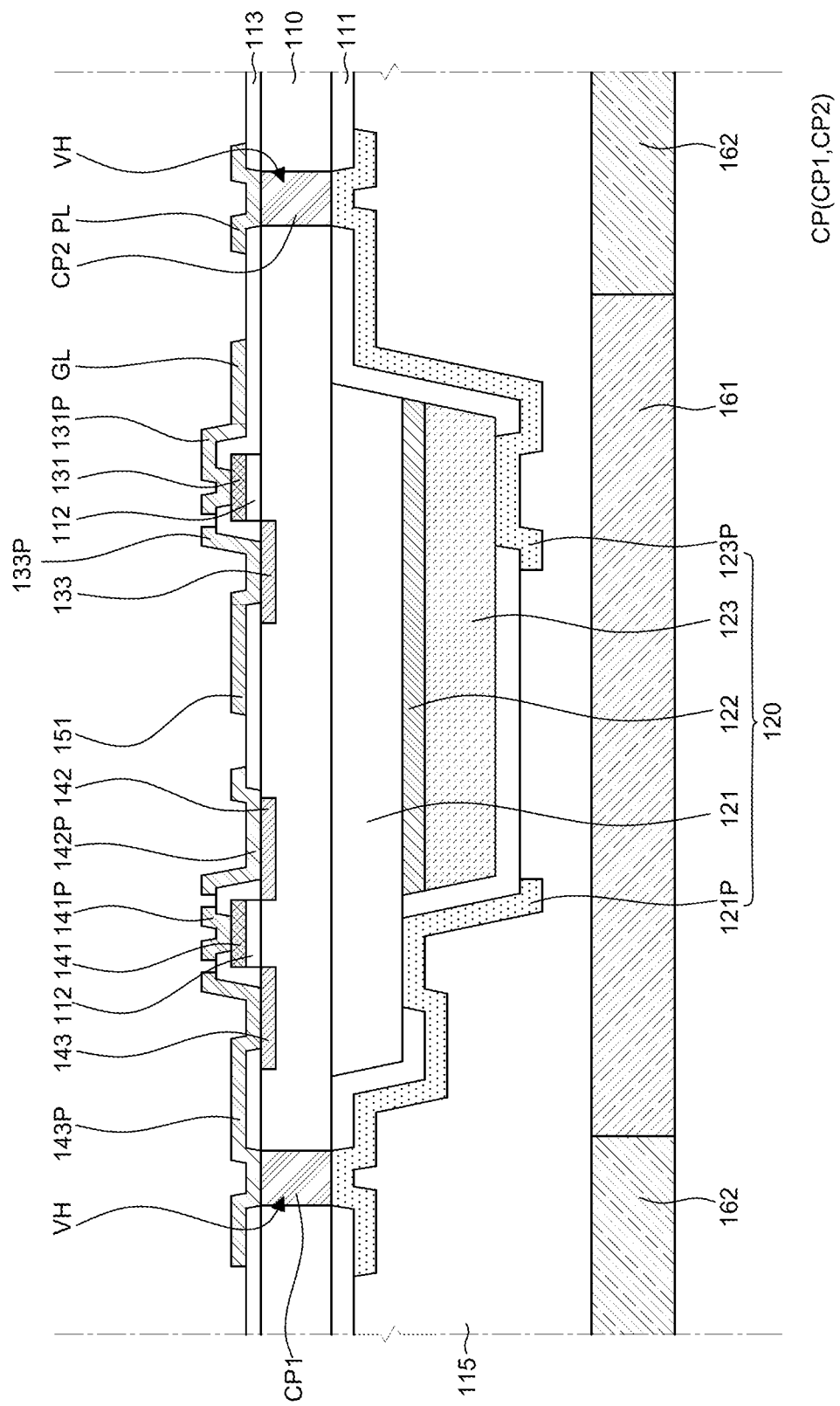

Referring to FIG. 5I, the gate line GL, the power line PL, the first gate pad electrode 131P, the first source pad electrode 132P, the first drain pad electrode 133P, the second gate pad electrode 141P, the second source pad electrode 142P, the second drain pad electrode 143P and the first capacitor electrode 151 are formed on the second passivation layer 113.

Specifically, a conductive material layer may be formed on the second passivation layer 113.

Subsequently, the conductive material layer may be etched, such that the gate line GL, the power line PL, the first gate pad electrode 131P, the first source pad electrode 132P, the first drain pad electrode 133P, the second gate pad electrode 141P, the second source pad electrode 142P, the second drain pad electrode 143P may be formed.

For example, the conductive material layer is etched, leaving the parts in the contact holes via which the first gate electrode 131, the first source region 132 and the first drain region 133 of the first semiconductor elements 130 and the second gate electrode 141, the second source region 142 and the second drain region 143 of the second semiconductor elements 140 are exposed, so that the first gate pad electrode 131P, the first source pad electrode 132P, the first drain pad electrode 133P, the second gate pad electrode 141P, the second source pad electrode 142P and the second drain pad electrode 143P can be formed.

The conductive material layer is etched, such that the first capacitor electrode 151 formed integrally with the first drain pad electrode 133P and the second gate pad electrode 141P may be formed.

At the same time, the conductive material layer is etched to form the gate line GL, which is integrated with the first gate pad electrode 131P and extended in the horizontal direction.

Then, the conductive material layer is etched so that the exposed contact hole of the second passivation layer 113 is filled with the first connection unit CP1, such that the power line PL extended in the horizontal direction can be formed.

Figure 5J:
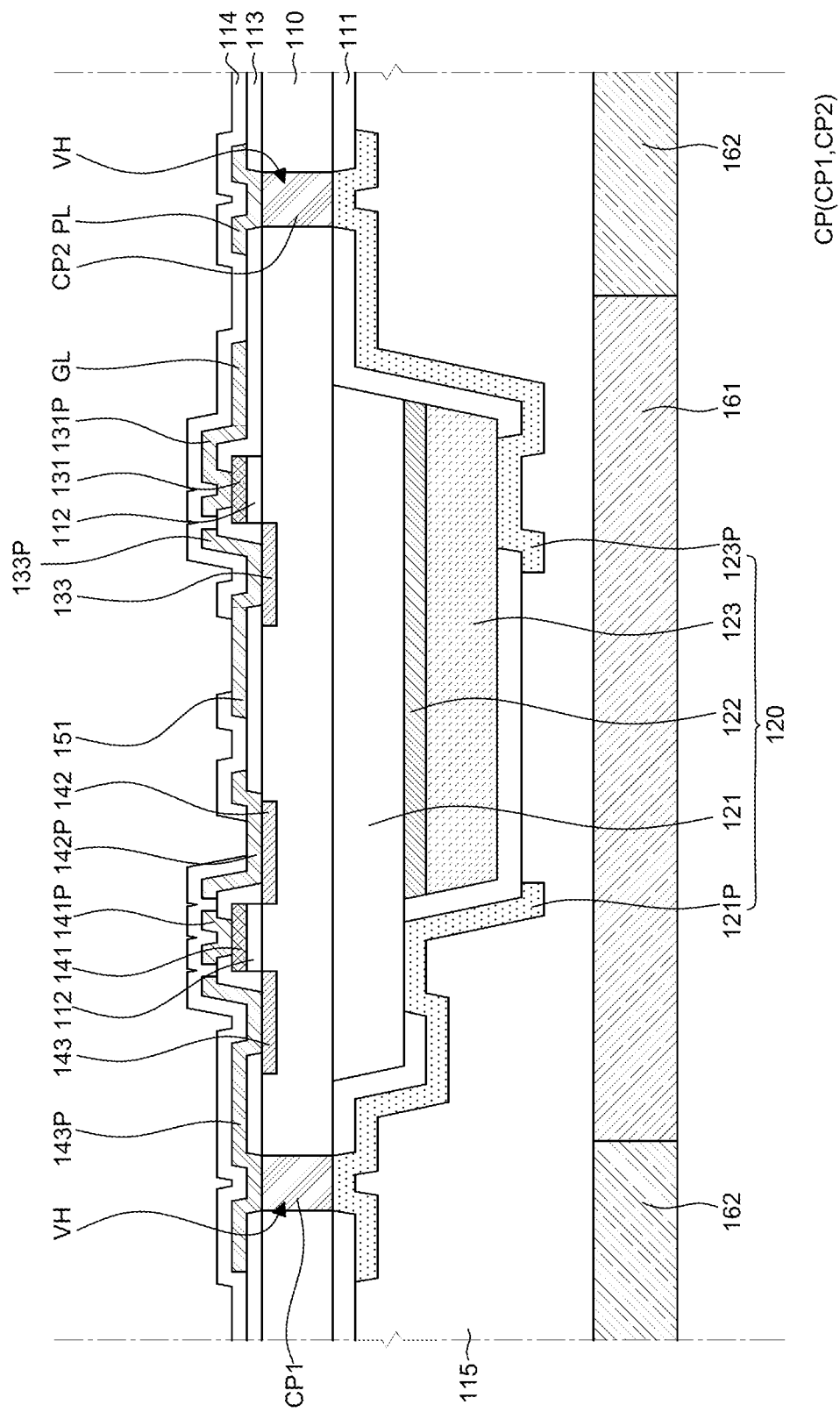

Referring to FIG. 5J, a third passivation layer 114 is formed on the gate line GL, the power line PL, the first gate pad electrode 131P, the first source pad electrode 132P, the first drain pad electrode 133P, the second gate pad electrode 141P, the second source pad electrode 142P, the second drain pad electrode 143P and the first capacitor electrode 151.

A third passivation material layer may be formed so that it covers the gate line GL, the power line PL, the first gate pad electrode 131P, the first source pad electrode 132P, the first drain pad electrode 133P, the second gate pad electrode 141P, the second source pad electrode 142P, the second drain pad electrode 143P and the first capacitor electrode 151.

Subsequently, the third passivation material layer may be etched to form contact holes. For example, to form a contact hole for connecting the second capacitor electrode 152 and the common line CL formed integrally with the second source pad electrode 142P, a part of the third passivation material layer covering the upper surface of the second source pad electrode 142P may be etched.

At the same time, to form a dielectric layer 153 on the first capacitor electrode 151 instead of the third passivation material layer, a part of the third passivation material layer covering the first capacitor electrode 151 may be etched.

Although not shown in the drawings, to form a contact hole for connecting the first source pad electrode 132P with the data line DL, a part of the third passivation material layer covering the upper surface of the first source pad electrode 132P may be etched.

Therefore, parts of the third passivation material layer that overlap with the first capacitor electrode 151 and the second source pad electrode 142P are etched, such that the third passivation layer 114 can be formed.

Figure 5K:
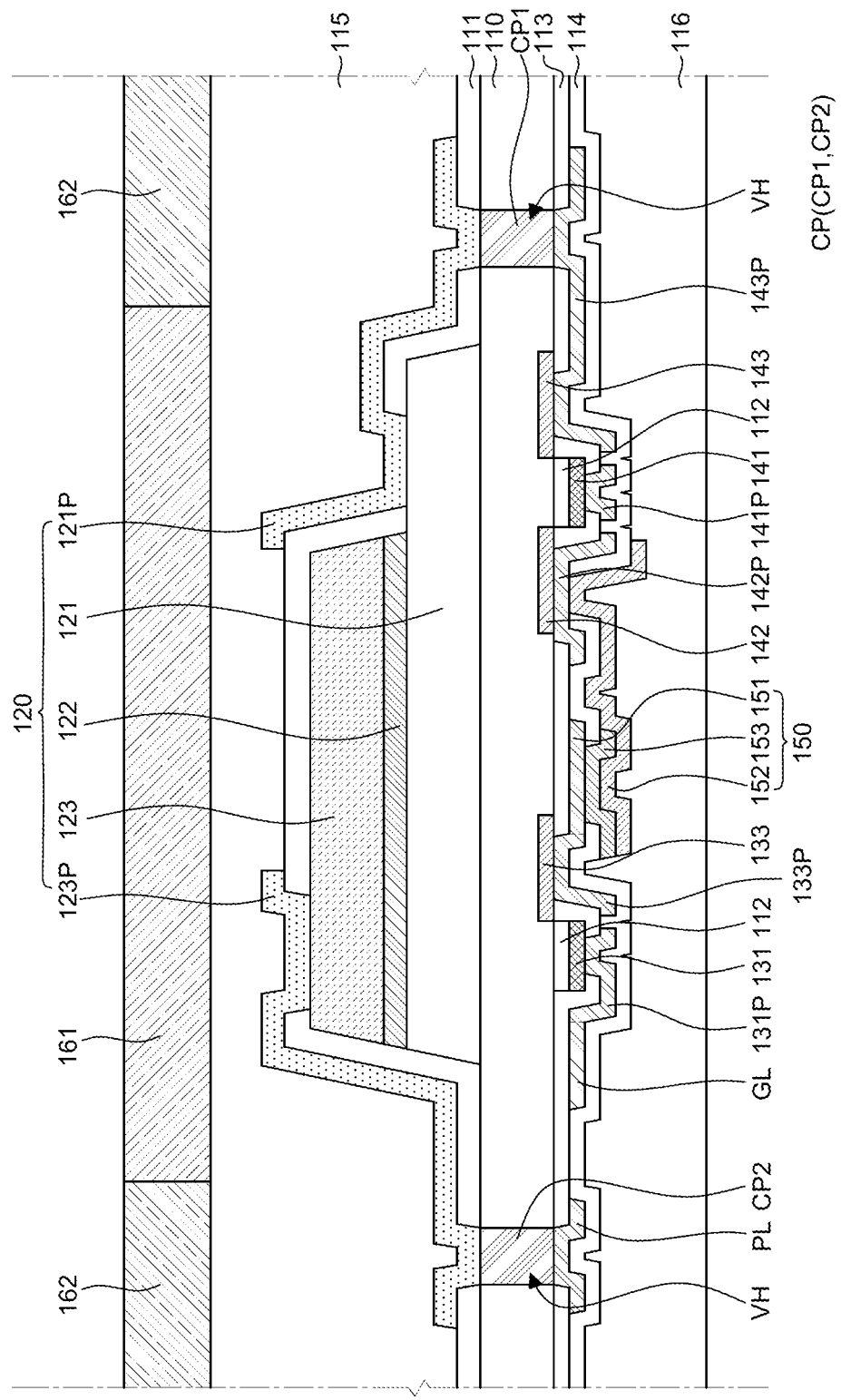

Referring to FIG. 5K, the common line CL, the data line DL, the dielectric layer 153 and the second capacitor electrode 152 are formed on the third passivation layer 114, such that the second protective layer 116 is formed to cover the entire lower surface of the substrate 110.

The dielectric layer 153 may be formed to cover the upper surface of the first capacitor electrode 151 exposed from the third passivation layer 114.

Subsequently, a conductive material layer may be formed on the dielectric layer 153 and the third passivation layer 114.

Subsequently, parts of the conductive material layer that do not overlap the dielectric layer 153 and the second source pad electrode 142P may be etched, such that the second capacitor electrode 152 may be formed. In this manner, the capacitor 150 including the first capacitor electrode 151, the dielectric layer 153 and the second capacitor electrode 152 can be formed.

At the same time, the conductive material layer may be etched to form the common line CL, which is integrated with the second capacitor electrode 152 and extended in the horizontal direction.

In addition, although not shown in the drawings, the conductive material layer may be etched to form the data line DL which is in contact with the first source pad electrode 132P exposed from the third passivation layer 114 and extended in the vertical direction.

Subsequently, the second protective layer 116 may be formed over the capacitor 150, the common line CL and the data line DL. The second protective layer 116 may be formed such that it entirely covers the plurality of driving units each including the first semiconductor element 130, the second semiconductor element 140 and the capacitor 150, and the plurality of lines including gate lines GL, data lines DL, power lines PL and common lines CL disposed on the lower surface of the substrate 110.

Although the LEDs 120 are formed on the upper surface of the substrate 110 and then the driving units are formed on the lower surface of the substrate 110 in the example shown in FIGS. 5A to 5K, it is to be noted that the driving units are formed on the lower surface of the substrate 110 and then the LEDs 120 may be formed on the upper surface of the substrate 110.

For example, after a plurality of driving units and a plurality of lines are formed on the lower surface of the substrate 110, an epitaxial layer 120m is formed on the upper surface of the substrate 110 at a low temperature by sputtering, to form a plurality of LEDs 120. As the LEDs 120 are formed at a low temperature, the driving units and the lines may not be damaged, and the LEDs 120 may be formed after forming the driving units and the lines. Therefore, the order of forming the LEDs 120, the driving units and the plurality of lines may vary depending on implementations and is not limited to that shown in FIGS. 5A to 5K.

Hereinafter, a process of determining the positions of the plurality of LEDs 120 taking into account the plurality of grooves VHi will be described with reference to FIGS. 6A to 6E.

FIGS. 6A to 6E are schematic cross-sectional views for illustrating an alignment process of a method of fabricating a display device according to an exemplary aspect of the present disclosure. Specifically, FIGS. 6A to 6E are schematic cross-sectional views for illustrating a process of forming a plurality of LEDs 120 on a substrate 110 in which alignment holes AH are formed.

Figure 6A:
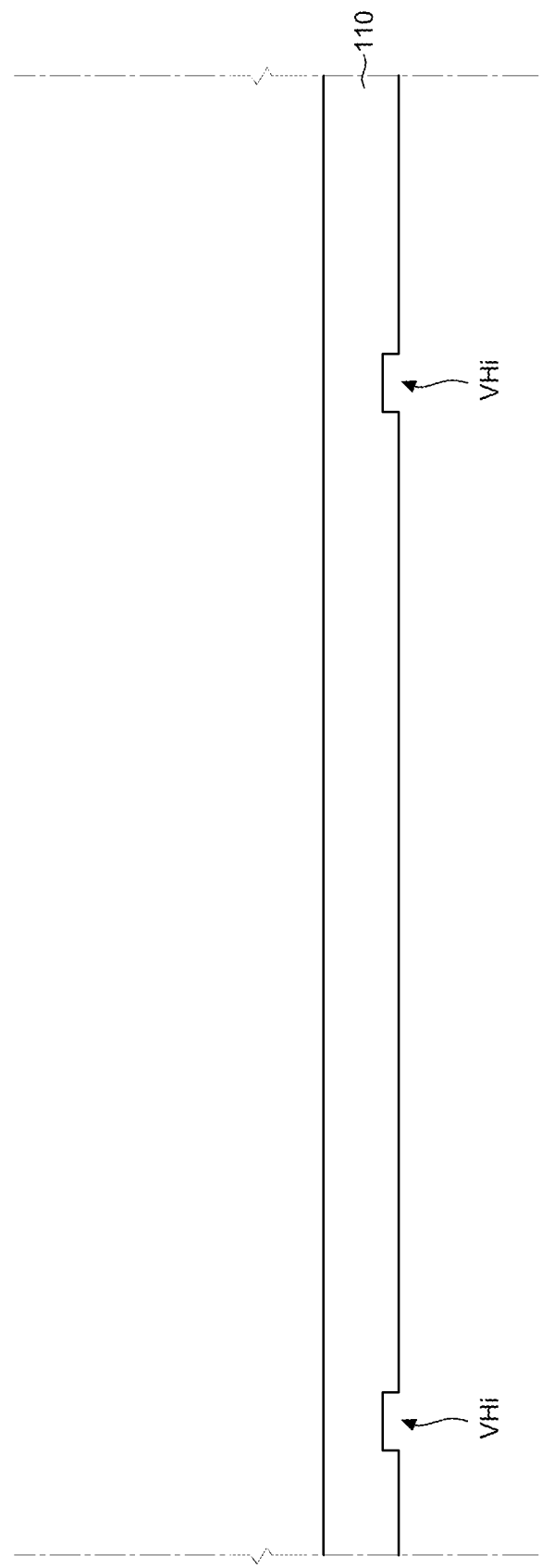
FIGS. 6A to 6E are schematic cross-sectional views for illustrating an alignment process of a method of fabricating a display device according to an exemplary aspect of the present disclosure.

Referring to FIG. 6A, a plurality of grooves VHi is formed in the lower surface of the substrate 110. The grooves VHi may be formed in line with the first pad electrode 121P and the second pad electrode 123P of each of the plurality of LEDs 120, respectively, and may be processes into a plurality of via holes VH in a subsequent process.

Figure 6B:
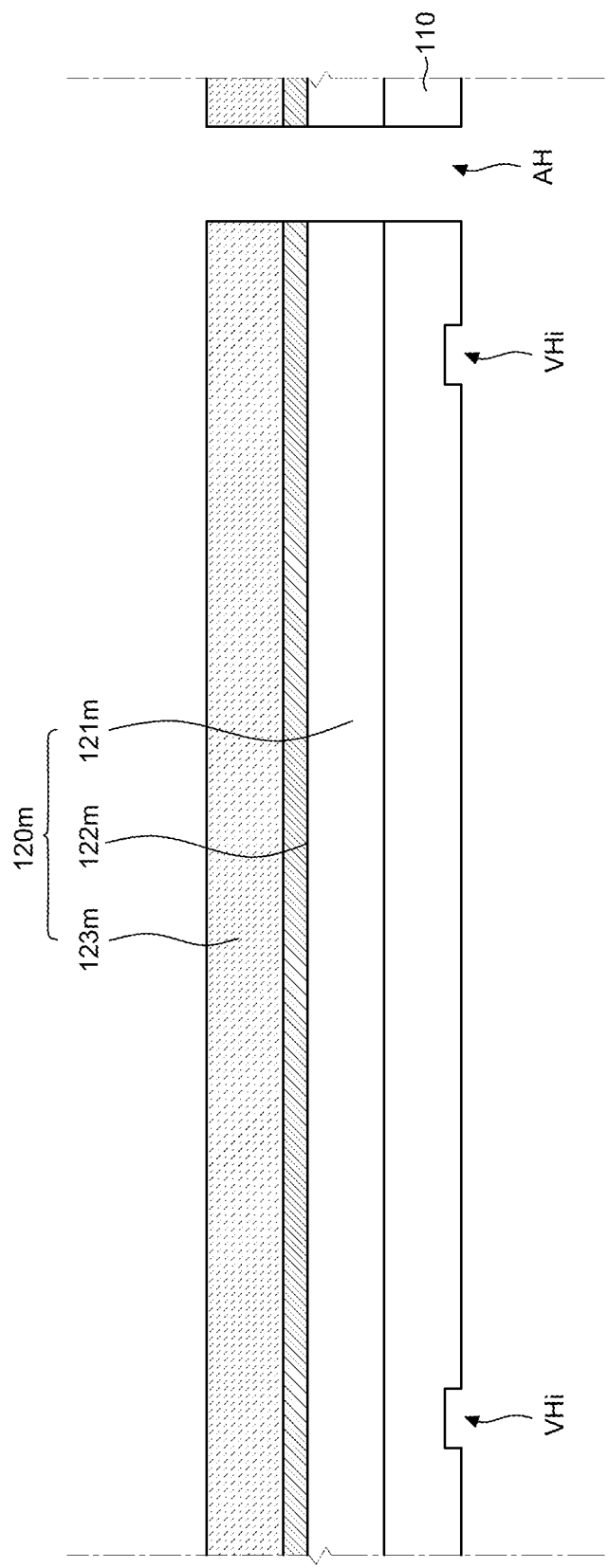

Referring to FIG. 6B, an epitaxial layer 120m and an alignment hole AH are formed on the entire upper surface of the substrate 110 having the plurality of grooves VHi formed therein.

A first semiconductor material layer 121m, a light-emitting material layer 122m and a second semiconductor material layer 123m may be sequentially formed on the substrate 110.

Subsequently, the alignment hole AH penetrating the epitaxial layer 120m and the substrate 110 may be formed.

Specifically, the alignment hole AH may be formed from the lower surface of the substrate 110. The alignment hole AH may be used to determine the etching positions of the epitaxial layer 120m, the contact hole positions of the first passivation layer 111, and the etching positions of the first pad electrode 121P and the second pad electrode 123P.

Although only one alignment hole AH is shown in FIG. 6B, this is merely illustrative. More than one alignment holes AH may be formed.

Although the epitaxial layer 120m is formed and then the alignment hole AH is formed in the above-described example, the order of forming the alignment hole AH is not limited thereto. The alignment hole AH may be formed in the substrate 110 before the epitaxial layer 120m is formed.

Figure 6C:
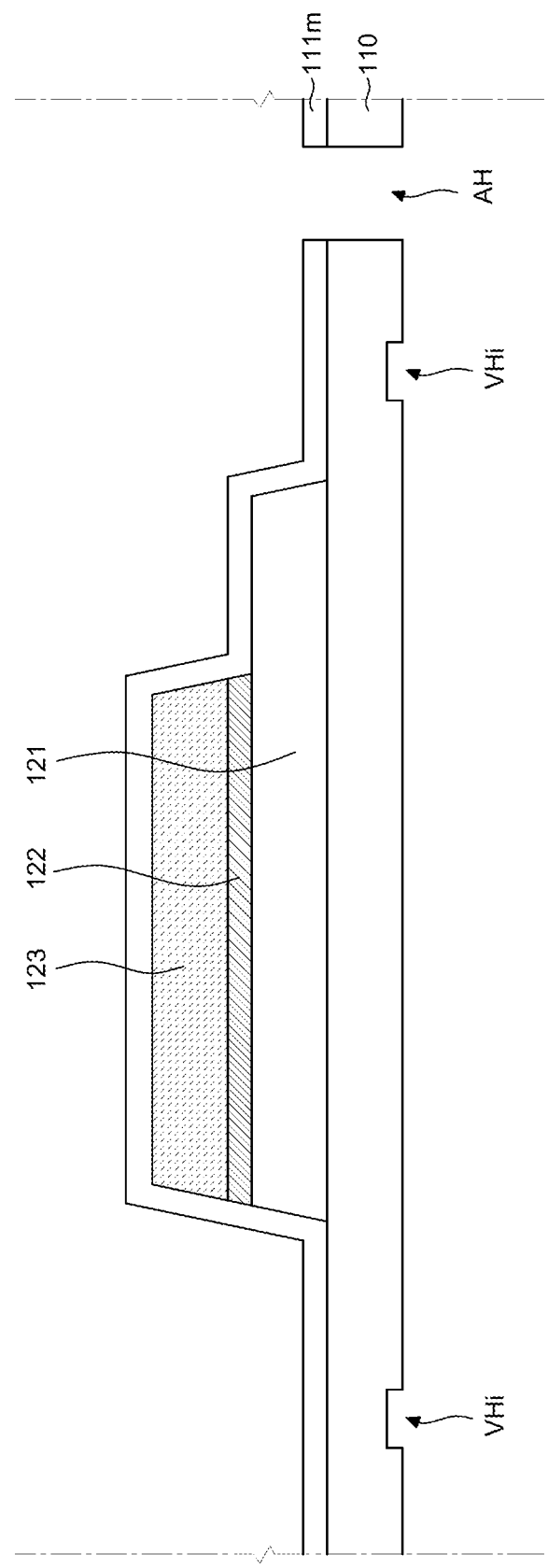

Referring to FIG. 6C, the epitaxial layer 120m is etched with reference to the alignment hole AH to form the first semiconductor layer 121, the emissive layer 122, and the second semiconductor layer 123.

Specifically, when the epitaxial layer 120m formed on the upper surface of the substrate 110 is etched, the epitaxial layer 120m has to be etched so that the upper surface of the substrate 110 overlapping the plurality of grooves VHi is exposed. The plurality of grooves VHi may be processed into via holes VH, in which connection units CP are formed, during a subsequent process. When the epitaxial layer 120m is etched, leaving parts that overlap the plurality of grooves VHi, the first pad electrode 121P and the second pad electrode 123P cannot be electrically connected to the plurality of connection units CP. Therefore, the epitaxial layer 120m must be etched so that the upper surface of the substrate 110 overlapping the plurality of grooves VHi is exposed. However, since the plurality of grooves VHi is not visible from the upper surface of the substrate 110, it may be difficult to determine the etching positions.

In view of the above, according to the exemplary aspect of the present disclosure, an alignment hole AH penetrating through the substrate 110 is formed so that it is possible to determine the part of the epitaxial layer 120 to be etched with respect to the alignment hole AH based on the positions of the grooves VHi from the alignment hole AH. Accordingly, the epitaxial layer 120m may be etched with respect to the alignment hole AH so that the upper surface of the substrate 110 overlapping the plurality of grooves VHi is exposed, to form the first semiconductor layer 121, the emissive layer 122 and the second semiconductor layer 123.

Subsequently, referring to FIG. 6C, the first passivation material layer 111m may be formed to cover the first semiconductor layer 121, the emissive layer 122 and the second semiconductor layer 123.

Figure 6D:
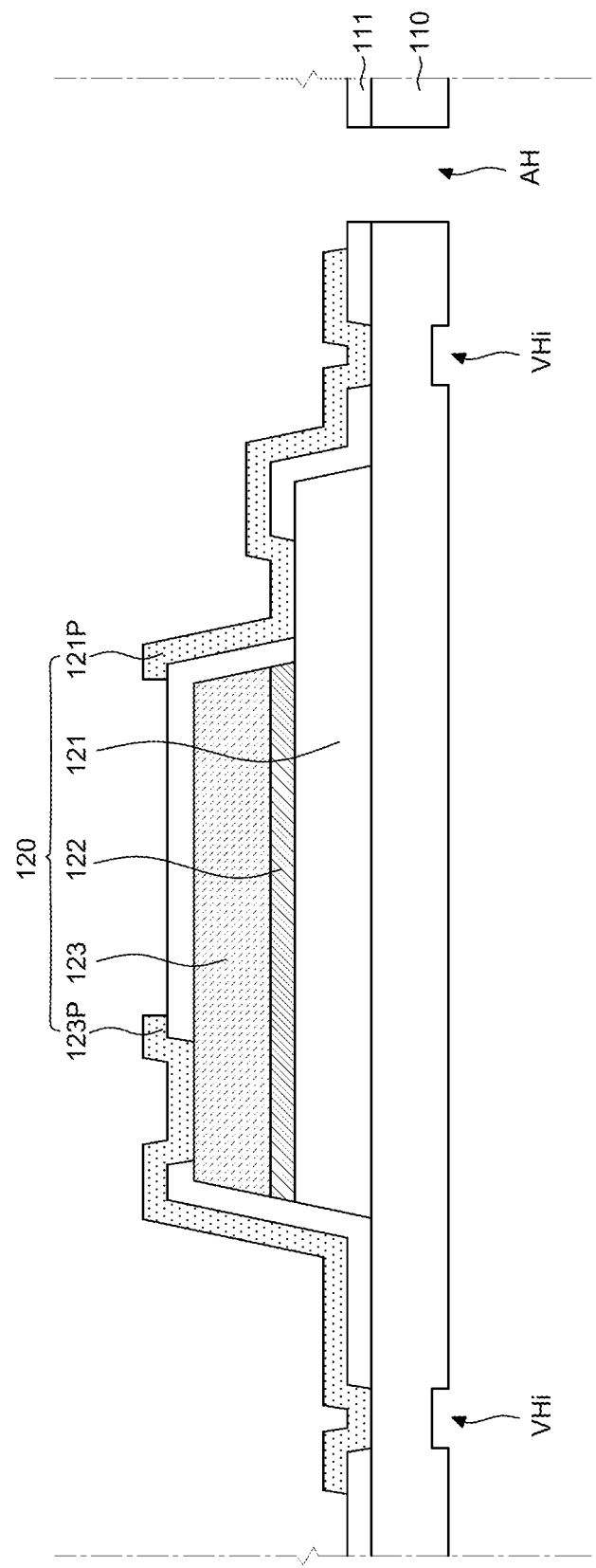

Subsequently, referring to FIG. 6D, the first passivation material layer 111m is etched with respect to the alignment hole AH so that the first passivation layer 111 is formed, and the first pad electrode 121P and the second pad electrode 123P are formed.

The first passivation material layer 111m covering the first semiconductor layer 121, the emissive layer 122 and the second semiconductor layer 123 may be etched, such that contact holes may be formed. For example, a part of the first passivation material layer 111m covering the upper surface of the first semiconductor layer 121 may be etched to form a contact hole via which the first semiconductor layer 121 can be connected to the first pad electrode 121P.

A part of the first passivation material layer 111m covering the upper surface of the second semiconductor layer 123 may be etched to form a contact hole via which the second semiconductor layer 123 can be connected to the second pad electrode 123P.

In addition, parts of the first passivation material layer 111m that overlap the plurality of grooves may be etched with respect to the alignment hole AH, to form contact holes. The contact holes of the first passivation layer 111 that overlap the grooves VHi may be contact holes for connecting the connection units CP with the first pad electrode 121P and the second pad electrode 123P.

After the first passivation layer 111 is formed, the first pad electrode 121P and a second pad electrode 123P may be formed on the first passivation layer 111.

Initially, a conductive material layer may be formed on the first passivation layer 111.

Subsequently, the conductive material layer is etched, so that the first pad electrode 121P and the second pad electrode 123P may be formed. For example, the conductive material layer may be etched, and accordingly the first pad electrode 121P may be formed so that it is in contact with the part of the upper surface of the substrate 110 overlapping with the groove VHi exposed from the contact hole of the first passivation layer 111 formed with respect to the alignment hole AH and the upper surface of the first semiconductor layer 121.

Likewise, the conductive material layer may be etched, and accordingly the second pad electrode 123P may be formed so that it is in contact with the part of the upper surface of the substrate 110 overlapping with the grooves VHi exposed from the contact hole of the first passivation layer 111 formed with respect to the alignment hole AH and the upper surface of the first semiconductor layer 123.

Figure 6E:
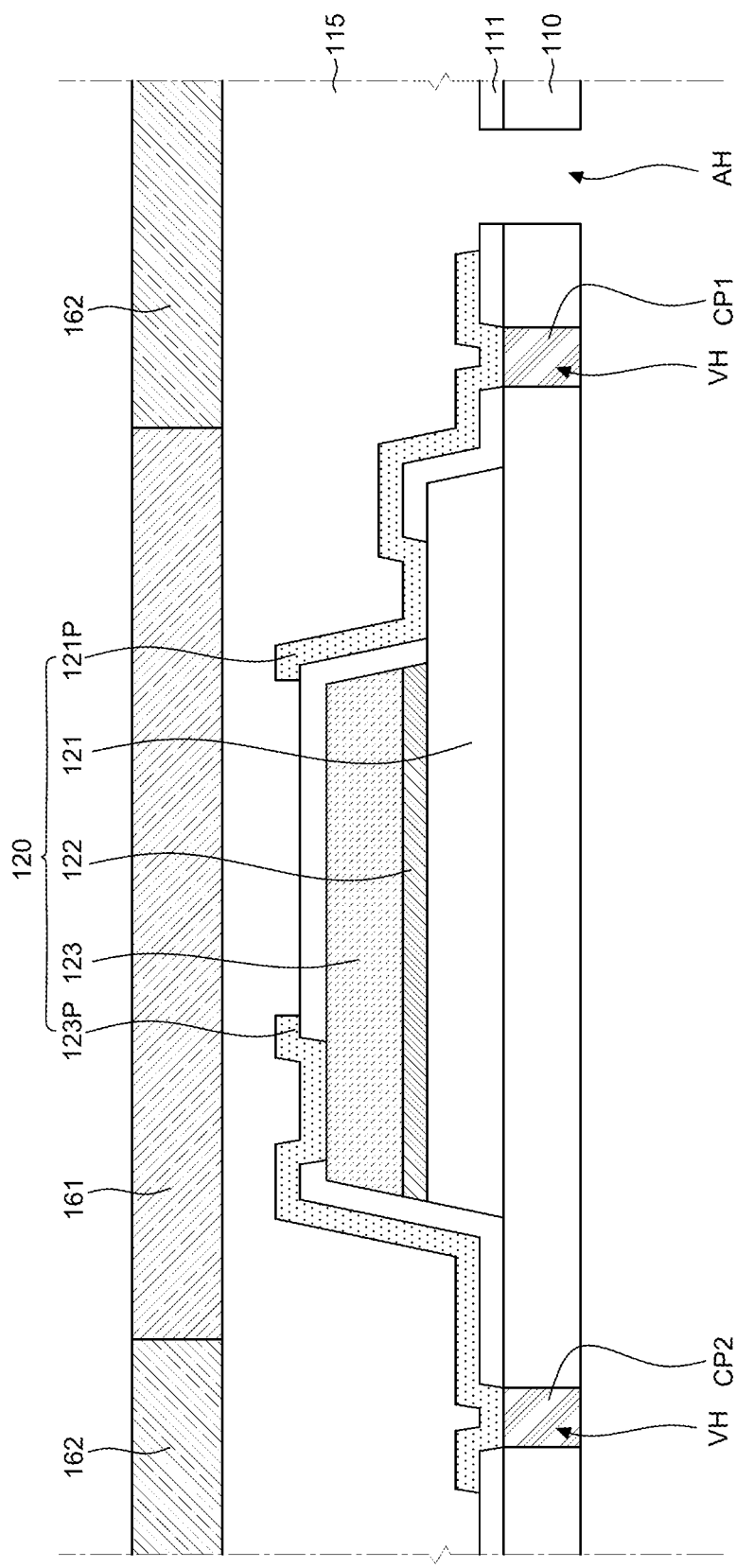

Subsequently, referring to FIG. 6E, a plurality of via holes VH and a plurality of connection units CP are formed in the substrate 110 on which the LEDs 120 have been formed.

The via holes VH may be formed from the grooves VHi formed in the lower surface of the substrate 110 on which the LEDs 120 have been formed. As the first pad electrode 121P and the second pad electrode 123P, which are formed with respect to the alignment hole AH, are formed so that their one ends overlap with the of grooves VHi, the first pad electrode 121P and the second pad electrode 123P may be exposed from a plurality of via holes VH on the lower surface of the substrate 110.

Subsequently, the plurality of connection units CP may be formed in the via holes VH, respectively. The connection units CP formed by filling the via holes VH with the conductive material may be in contact with the first pad electrode 121P and the second pad electrode 123P, respectively.

According to the method of fabricating a display device 100 according to an exemplary aspect of the present disclosure, the LEDs 120 are formed on the upper surface of the substrate 110 while the driving units on the lower surface thereof, and thus the emission area of the LEDs 120 can be increased. Specifically, the LEDs 120 may receive voltages from the driving units and the plurality of lines to emit light. As the LEDs 120 are formed the surface of the substrate 110 different from the surface on which the driving units and the lines are formed, the LEDs 120 may be electrically connected to the driving units and the lines through the connection units CP penetrating the substrate 110. In this manner, even though the LEDs 120 are formed on the surface different from the surface on which the driving units and the lines are formed, the LEDs 120 can emit light by way of forming the connection units CP penetrating through the substrate 110. Moreover, since only the LEDs 120 are disposed on the upper surface of the substrate 110 while the driving units and the plurality of lines are disposed on the lower surface of the substrate 110, the emission area of the LEDs 120 can be increased, compared with a display device in which LEDs, driving units and a plurality of lines are disposed on the same side. Therefore, according to the method according to the exemplary aspect of the present disclosure, the LEDs 120 and the driving units and the lines are formed on different surfaces of the substrate 110 and they can be electrically connected to one another, so that the emission area of the LEDs 120 can be increased, thereby providing the display device 100 having improved efficiency and the luminance.

In the display device 100 according to the exemplary aspect of the present disclosure, it is possible to easily align the LEDs 120 formed on the upper surface of the substrate 110 with the plurality of driving units and the plurality of lines formed on the lower surface of the substrate 110 by using the alignment holes AH. For example, the first semiconductor layer 121 of the LED 120 may be electrically connected to the second drain region 143 of the second semiconductor element 140, and the second semiconductor layer 123 may be electrically connected to the power line PL, so that light can be emitted by using the voltage applied from the power line PL and the second drain region 143. The LEDs 120 may be electrically connected to the plurality of driving units and the plurality of lines by the plurality of connection units CP penetrating through the substrate 110. To form the LEDs 120, the epitaxial layer 120m is formed on the entire upper surface of the substrate 110, and the epitaxial layer 120m has to be etched so that the positions where the connection units CP are to be formed are exposed. However, since the epitaxial layer 120m, on which the LEDs 120 are formed, is opaque, the positions where the connection units CP are to be formed may not be seen from the upper surface of the substrate 110. Similarly, to form the plurality of driving units, the conductive material layer is formed on the entire lower surface of the substrate 110 and then etched. Since the positions where the connection units CP are to be formed are covered by the opaque conductive material layer and cannot be seen. Therefore, it may be difficult to determine the etching positions. In view of the above, in the display device 100 according to the exemplary aspect of the present disclosure, an alignment hole AH penetrating through the substrate 110 is formed, such that the LEDs 120, the driving units and the like may be formed with respect to the alignment hole AH so that they are in line with the positions where the connection units CP are formed. By doing so, the LEDs 120, the driving units and the lines can be formed in line with the connection units CP, and the LEDs 120 on the upper surface of the substrate 110 can be electrically connected to the driving units and lines on the lower surface of the substrate 110.

Figure 7A:
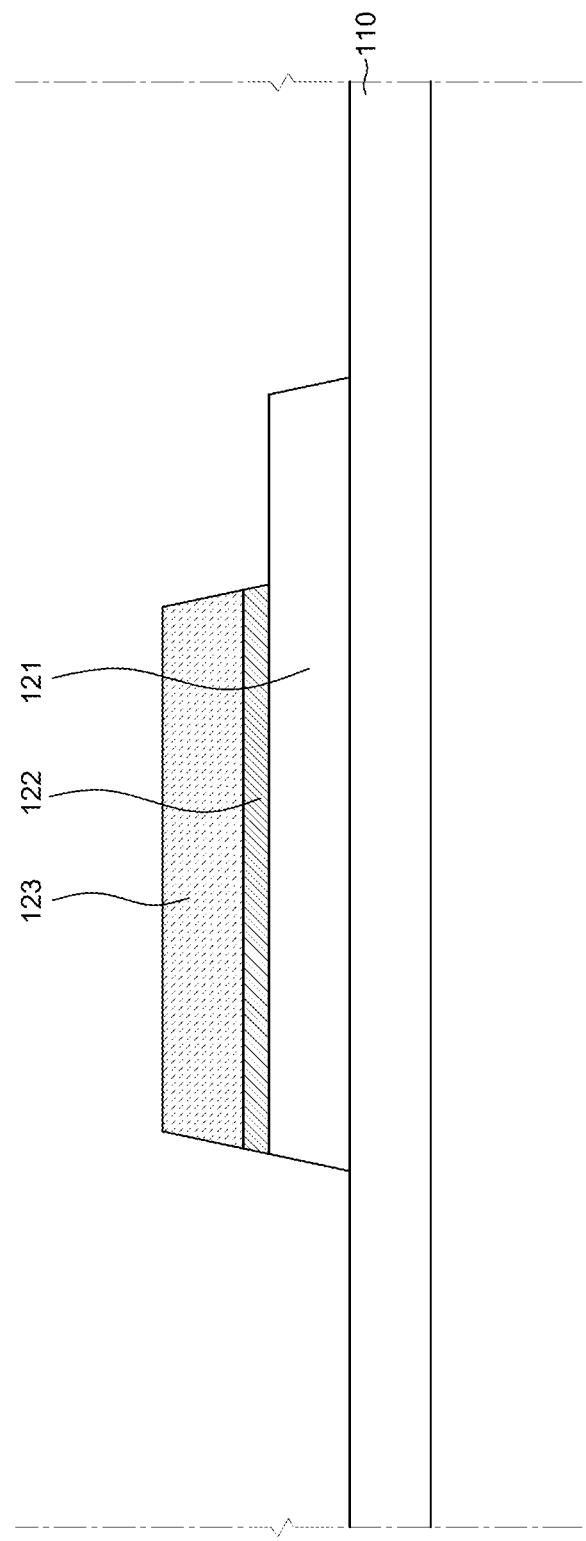
FIGS. 7A to 7C are schematic cross-sectional views for illustrating processing steps of a method of fabricating a display device according to another exemplary aspect of the present disclosure.
Figure 7B:
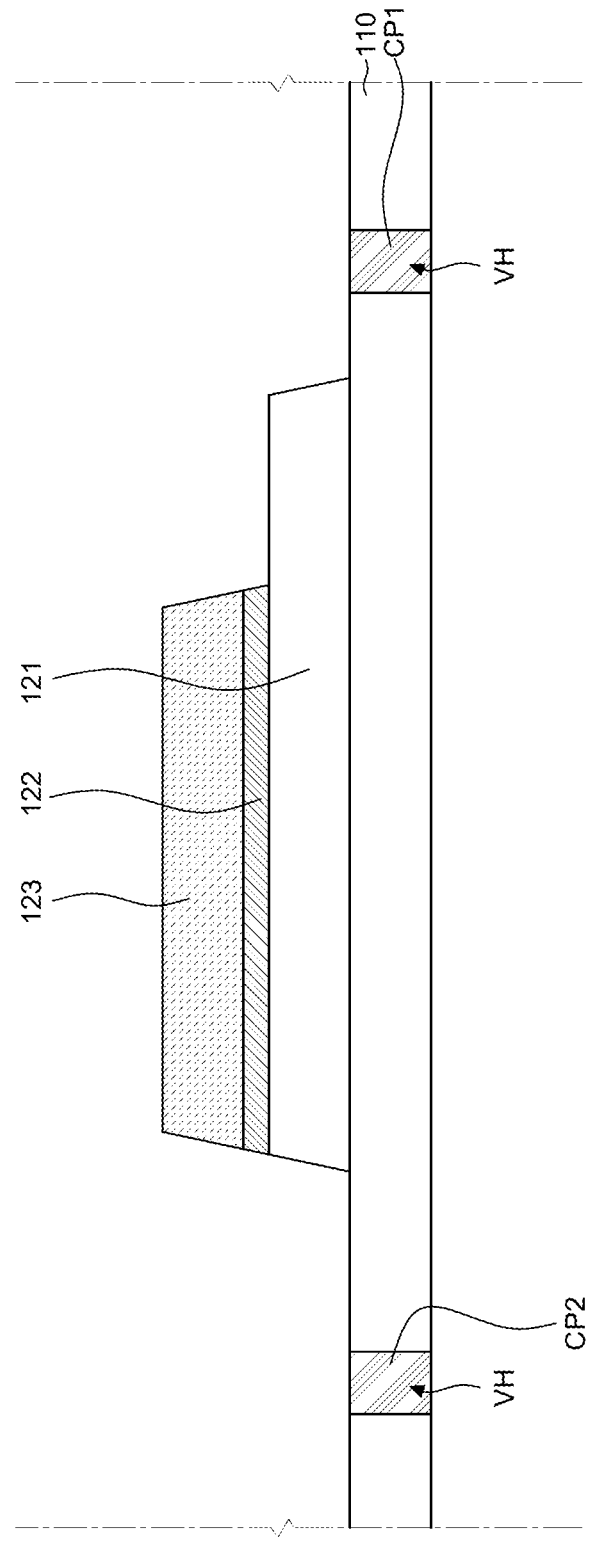
Figure 7C:
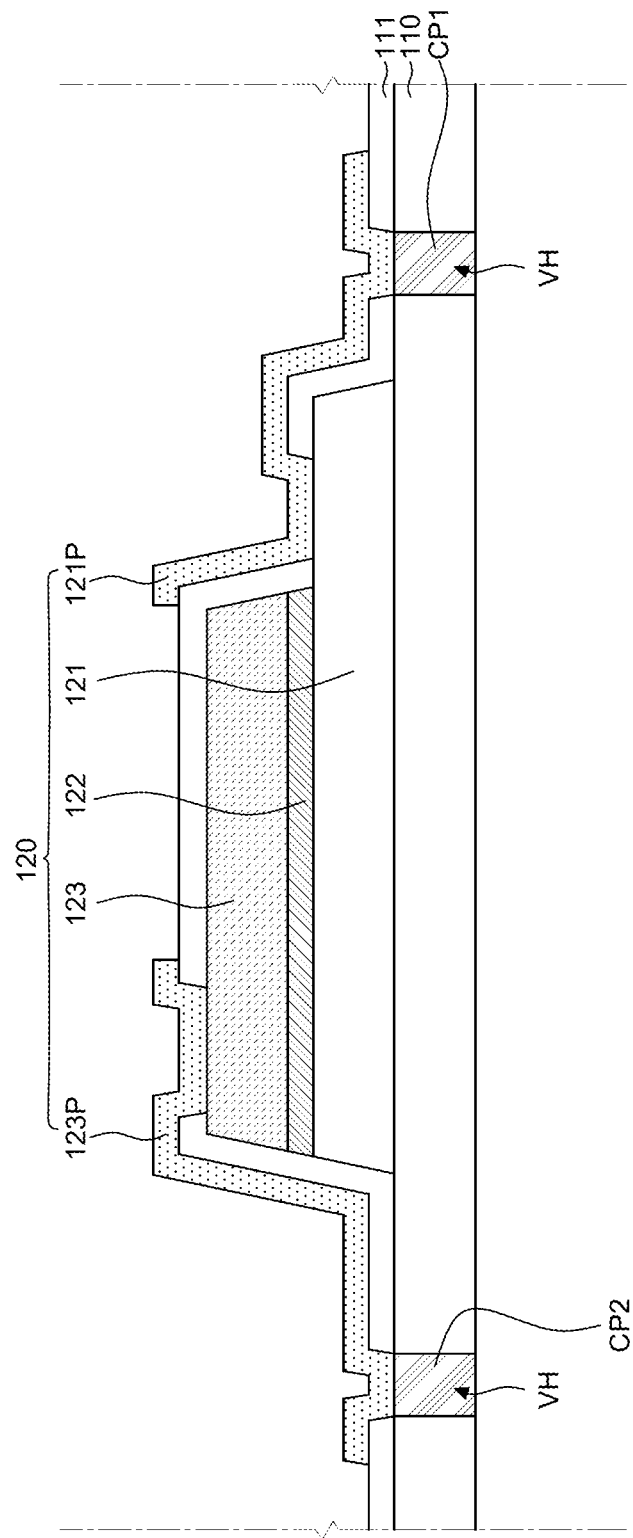

FIGS. 7A to 7C are schematic cross-sectional views for illustrating processing steps of a method of fabricating a display device according to another exemplary aspect of the present disclosure. Specifically, FIGS. 7A to 7C are schematic cross-sectional views for illustrating processing steps of forming a plurality of LEDs 120 on the upper surface of the substrate 110. A display device shown in FIGS. 7A to 7C is substantially identical to the display device shown in FIGS. 1 to 6E except for a process of forming a plurality of via hole VH and a plurality of connection units CP; and, therefore, the redundant description will be omitted.

Referring to FIG. 7A, a first semiconductor layer 121, an emissive layer 122 and a second semiconductor layer 123 of each of the plurality of LEDs 120 are formed on the upper surface of a substrate 110. Specifically, a first semiconductor material layer 121m, a light-emitting material layer 122m and a second semiconductor material layer 123m are sequentially formed on the upper surface of the substrate 110, so that an epitaxial layer 120m can be formed.

Subsequently, the second semiconductor material layer 123m, the light-emitting material layer 122m and the first semiconductor layer 121m are sequentially etched, so that the second semiconductor layer 123, the emissive layer 122 and the first semiconductor layer 121 of each of the plurality of LEDs 120 can be formed.

Referring to FIG. 7B, a plurality of via holes VH and a plurality of connection units CP are formed in the substrate 110.

More specifically, the via holes VH may be formed in parts of the substrate 110 that do not overlap with the first semiconductor layer 121, the emissive layer 122 and the second semiconductor layer 123 of each of the plurality of LEDs 120, and the connection units CP may be formed therein, respectively.

Referring to FIG. 7C, the first passivation layer 111, the first pad electrode 121P and the second pad electrode 123P are formed on the connection units CP and the substrate 110 on which the first semiconductor layer 121, the emissive layer 122 and the second semiconductor layer 123 are formed.

Initially, a first passivation material layer 111m may be formed on the entire upper surface of the substrate 110 so that the connection units CP, the first semiconductor layer 121, the emissive layer 122, and the second semiconductor layer 123 are covered.

Subsequently, the first passivation material layer 111m may be etched to form contact holes. For example, contact holes may be formed by etching the first passivation material layer 111m covering the upper surface of the first semiconductor layer 121, the upper surface of the second semiconductor layer 123 and the plurality of connection units CP. Accordingly, the first passivation layer 111 having contact holes may be formed.

Subsequently, the first pad electrode 121P and the second pad electrode 123P may be formed on the first passivation layer 111.

Initially, a conductive material layer may be formed on the first passivation layer 111.

Subsequently, the conductive material layer is etched, so that the first pad electrode 121P and the second pad electrode 123P may be formed. For example, the conductive material layer is etched, and accordingly the first pad electrode 121P is formed so that it is in contact with the connection units CP and the upper surface of the first semiconductor layer 121 exposed from the contact holes of the first passivation layer 111.

The conductive material layer is etched, and accordingly the second pad electrode 123P is formed so that it is in contact with the connection units CP and the upper surface of the second semiconductor layer 123 exposed from the contact holes of the first passivation layer 111.

According to the method of fabricating a display device according to another exemplary aspect of the present disclosure, the plurality of via holes VH is formed when the epitaxial layer 120m is etched, such that the process of aligning the epitaxial layer 120m with the plurality of grooves VHi can be simplified. Specifically, to form the connection units CP penetrating through the substrate 110, the plurality of via holes VH may be formed in the substrate 110. In addition, the first pad electrode 121P and the second pad electrode 123P of each of the plurality of LEDs 120 formed on the upper surface of the substrate 110 are formed to be in contact with the plurality of connection units CP and thus may be electrically connected to the driving units and lines on the lower surface of the substrate 110. At this time, to form the LEDs 120, the epitaxial layer 120m is formed on the entire upper surface of the substrate 100, and the epitaxial layer 120m may be etched into several pieces, to form the LEDs 120. Since the epitaxial layer 120m has to be etched taking into account the positions at which the connection units CP are to be formed, a process and method of aligning the positions of the connection units CP with the etching positions of the epitaxial layer 120m are required. In this regard, according to the method of fabricating a display device according to this exemplary aspect, the plurality of via holes VH, in which the connection units CP are to be formed, is formed in the substrate 110 at the same time when the epitaxial layer 120m is etched, so that the process of aligning the etching positions of the epitaxial layer 120m with the positions of the connection units CP can be simplified.

Figure 8:
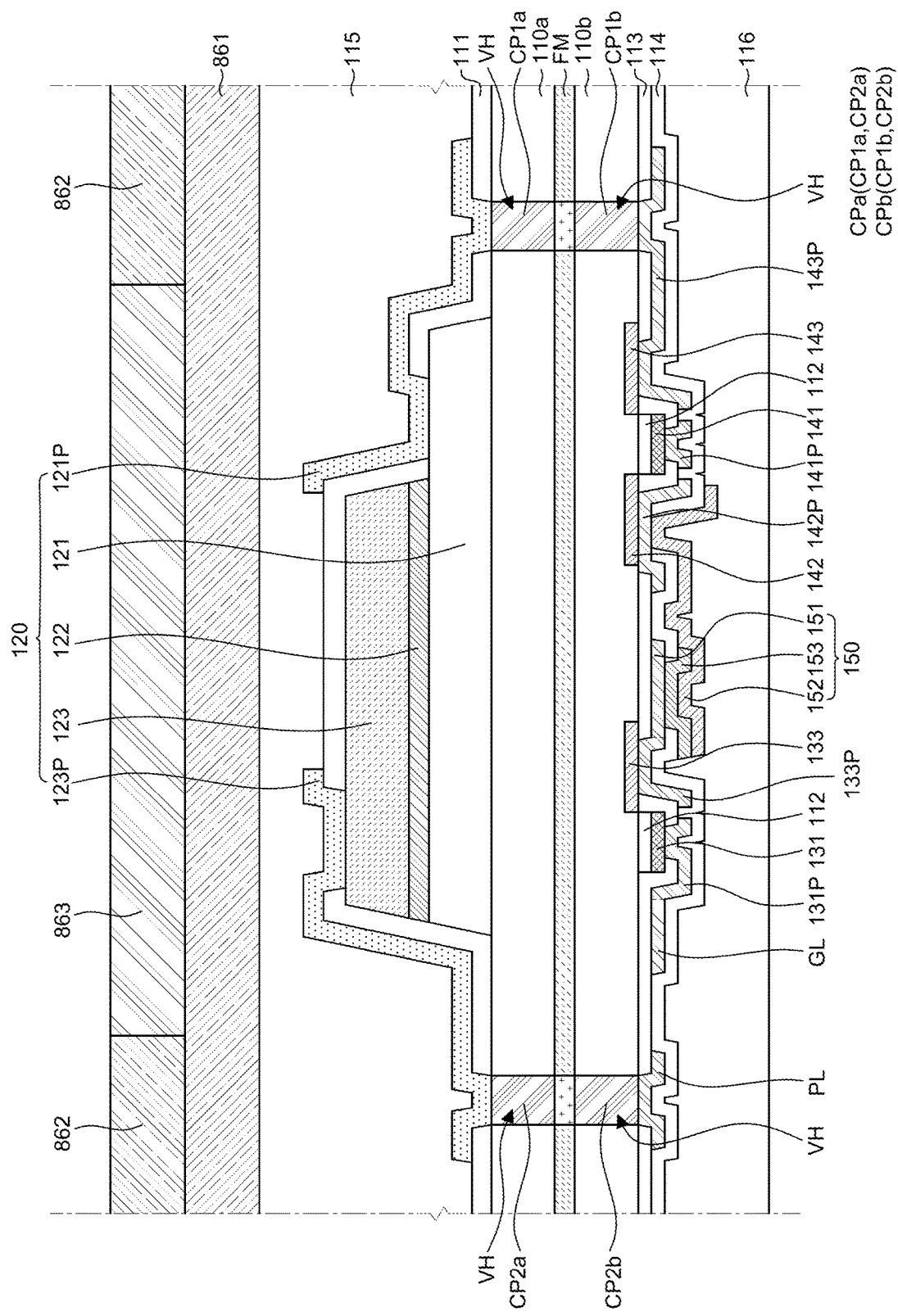
FIG. 8 is a cross-sectional view of a sub-pixel of a display device according to yet another exemplary aspect of the present disclosure.

FIG. 8 is a cross-sectional view of a sub-pixel of a display device according to yet another exemplary aspect of the present disclosure. A display device shown in FIG. 8 is substantially identical to the display device 100 shown in FIGS. 1 to 4 except that the former further includes a first substrate 110a, a second substrate 110b and color filters 863, and includes a different light-converting layer 861; and, therefore, the redundant description will be omitted.

Referring to FIG. 8, the substrates include a first substrate 110a and a second substrate 110b. The lower surface of the first substrate 110a faces the upper surface of the second substrate 110b.

A plurality of LEDs 120 is disposed on the first substrate 110a. A plurality of first semiconductor elements 130, a plurality of second semiconductor elements 140, a plurality of capacitors 150, a plurality of gate lines GL, a plurality of data lines DL, a plurality of power lines PL, and a plurality of common lines CL are disposed under the second substrate 110b.

The connection units CPa and CPb are disposed on the first substrate 110a and the second substrate 110b, respectively. Specifically, a plurality of connection units CPa penetrating through the first substrate 110a is formed so that they come in contact with a first pad electrode 121P and a second pad electrode 123P of each of the plurality of LEDs 120 on the upper surface of the first substrate 110a. A plurality of connection units CPb penetrating through the second substrate 110b is formed so that they come in contact with the power line PL and the second drain pad electrode 143P on the lower surface of the second substrate 110b.

For example, a first connection unit CP1a penetrating through the first substrate 110a may be disposed so that it is in contact with the first pad electrode 121P of the first substrate 110a, and a second connection unit CP2a penetrating through the first substrate 110a may be disposed so that it is in contact with the second pad electrode 123P of the first substrate 110a. A first connection unit CP1b penetrating through the second substrate 110b may be disposed so that it is in contact with the second drain pad electrode 143P of the second substrate 110b, and a second connection unit CP2b penetrating through the second substrate 110b may be disposed so that it is in contact with the power line PL of the second substrate 110b.

The first substrate 110a and the second substrate 110b are attached to each other so that the LEDs 120 of the first substrate 110a are electrically connected to the second drain pad electrode 143P and the power line PL of the second substrate 110b. The connection units CPa of the first substrate 110a and the connection units CPb of the second substrate 110b may be electrically connected to each other.

For example, the first connection unit CP1a of the first substrate 110a may overlap the first connection unit CP1b of the second substrate 110b. A conductive ball may be disposed between the first connection unit CP1a of the first substrate 110a and the first connection unit CP1b of the second substrate 110b to electrically connect them. Accordingly, the first pad electrode 121P of the LEDs 120 connected to the first connection unit CP1a of the first substrate 110a can be electrically connected to the second drain pad electrode 143P connected to the first connection unit CP1b of the second substrate 110b.

The second connection unit CP2a of the first substrate 110a may overlap the second connection unit CP2b of the second substrate 110b. A conductive ball may be disposed between the second connection unit CP2a of the first substrate 110a and the second connection unit CP2b of the second substrate 110b to electrically connect them. Accordingly, the second pad electrode 123P of the LEDs 120 connected to the second connection unit CP2a of the first substrate 110a can be electrically connected to the power line PL connected to the second connection unit CP2b of the second substrate 110b.

Although the connection units CPa of the first substrate 110a are electrically connected to the connection units CPb of the second substrate 110b through the conductive balls in the example shown in FIG. 8, the present disclosure is not limited thereto. The connection units CPa of the first substrate 110a may be electrically connected to the connection units CPb of the second substrate 110b, for example, by soldering.

The first substrate 110a and the second substrate 110b may be spaced apart from each other by the conductive balls disposed between the connection units CPa and the connection units CPb.

A filling member FM is disposed between the lower surface of the first substrate 110a spaced apart from the upper surface of the second substrate 110b. The filling member FM can suppress the permeation of foreign substances or the like between the first substrate 110a and the second substrate 110b and can keep the first substrate 110a and the second substrate 110b attached together reliably. For example, the filling member FM may be disposed only on the edge portion of the lower surface of the first substrate 110a and the edge portion of the upper surface of the second substrate 110b adjacent to the side surfaces of the first substrate 110a and the second substrate 110b, or may be disposed on the entire lower surface of the first substrate 110a and the entire upper surface of the second substrate 110b. The arrangement of the filling member FM is not particularly limited herein as long as it can prevent foreign matters from permeating between the first substrate 110a and the second substrate 110b.

The light-converting layer 861 and the color filters 863 are disposed on the first protective layer 115 covering the LEDs 120.

The single light-converting layer 861 may be disposed on all of a plurality of sub-pixels SPR, SPG and SPB. The light-converting layer 861 may be, for example, a yellow light-converting layer 861. As described above, when the LEDs 120 are the blue LEDs 120 emitting blue light, the yellow light-converting layer 861 may be disposed above the LEDs 120, such that the blue light emitted from the LEDs 120 can be converted into white light. Therefore, by disposing the yellow light-converting layer 861 above the LEDs 120 that emit blue light, it is possible to convert the light emitted from the LEDs 120 into white light.

It is to be understood that when the LEDs 120 emit light of different colors, a light-converting layer 861 of a color other than white may be disposed. The type of the light-converting layer 861 is not particularly limited herein as long as the light-converting layer 861 can convert light emitted from the LEDs 120 into white light.

The light-converting layer 861 may be implemented by inkjet printing or dotting a photo-acryl, silicon oxide SiOx or silicon nitride SiNx in which light-converting material such as nano phosphor, organic fluorescent material and quantum dots is distributed over the LEDs 120 or may be implemented by using a sheet containing the light-converting material. For example, when the light-converting layer 861 is a yellow light-converting layer 861, a single kind of light-converting material such as yellow phosphor may be distributed in the light-converting layer 861. Alternatively, different kinds of light-converting materials may be distributed such as a red phosphor and green phosphor. It is, however, to be understood that the present disclosure is not limited thereto.

On the other hand, when light-converting layer 861 is implemented as a sheet or the like, some of light pass through the sheet, the other of the light may be reflected off the sheet. In such case, although not shown in the drawings, a light-absorbing polarizing plate may be further disposed on the light converting layer 861, for increasing the transmittance of the sheet of the light-converting layer 861 and absorbing the light of a particular wavelength to increase the color gamut. For example, an S-wave may be generated from the light reflected off the sheet of yellow light-converting layer 861. When this happens, the light-absorbing polarizing plate may convert the S-wave into a P-wave to increase the transmittance of the sheet of yellow light-converting layer 861. The light-absorbing polarizing plate can absorb light between the red and green wavelength band from the light converted by the yellow light-converting layer 861, so that the color purity of the green light and the red light can be improved, thereby improving the color gamut of the display device.

The color filters 863 are disposed on the light-converting layer 861. The color filters 863 are disposed in the sub-pixels SPR, SPG and SPB, respectively. The color filters 863 can convert the light that has passed through the light-converting layer 861 into light having a different wavelength. It is to be noted that the color filters 863 are not essential elements and thus may be eliminated depending on the design choice.

For example, a red color filter 863 may be disposed in a red sub-pixel SPR, and white light from the light-converting layer 861 may be converted into red light through the red color filter 863. A green color filter 863 may be disposed in a green sub-pixel SPG, and white light from the light-converting layer 861 may be converted into green light through the green color filter 863. A blue color filter 863 may be disposed in a blue sub-pixel SPB, and white light from the light-converting layer 861 may be converted into blue light through the blue color filter 863.

A plurality of light-blocking layers 862 is disposed between the color filters 862. The light-blocking layers 862 may be disposed at boundaries between the sub-pixels SPR, SPG and SPB. The light-blocking layers 862 can block the light emitted from each of the LEDs 120 traveling toward other sub-pixels SPR, SPG and SPB to thereby suppress the color mixture of light. For example, the light-blocking layers 862 may be implemented as, but is not limited to, a black matrix or a reflective material.

According to this exemplary aspect of the present disclosure, the LEDs 120 and the driving units and lines formed on different substrates 110a and 110b can be implemented as a single display device. Specifically, the display device can be implemented by attaching the first substrate 110a on which the LEDs 120 are disposed and the second substrate 110b on which the plurality of driving units and the plurality of lines are disposed. The LEDs 120 may be disposed on the upper surface of the first substrate 110a while the driving units and the plurality of lines may be disposed on the lower surface of the second substrate 110b. Then, by disposing the lower surface of the first substrate 110a to face the upper surface of the second substrate 110b, a plurality of connection units CPa penetrating through the first substrate 110a is electrically connected to a plurality of connection units CPb penetrating through the second substrate 110b, so that the LEDs 120 can be electrically connected to the driving units and the plurality of lines. In addition, by further disposing the filling member FM between the lower surface of the first substrate 110a and the upper surface of the second substrate 110b, it is possible to suppress foreign substances from permeating between the first substrate 110a and the second substrate 110b. Accordingly, in the display device according to this exemplary aspect of the present disclosure, the LEDs 120 of the first substrate 110a can be electrically connected to the driving units the plurality of lines of the second substrate 110b, and the reliability of the display device can be improved by disposing the filling member FM between the first substrate 110a and the second substrate 110b.

FIGS. 9A to 9E are schematic cross-sectional views for illustrating processing steps of a method of fabricating a display device according to yet another exemplary aspect of the present disclosure. A display device shown in FIGS. 9A to 9E is substantially identical to the display device 100 shown in FIGS. 1 to 6E except that substrates include a first substrate 110a and a second substrate 110b; and, therefore, the redundant description will be omitted.

Figure 9A:
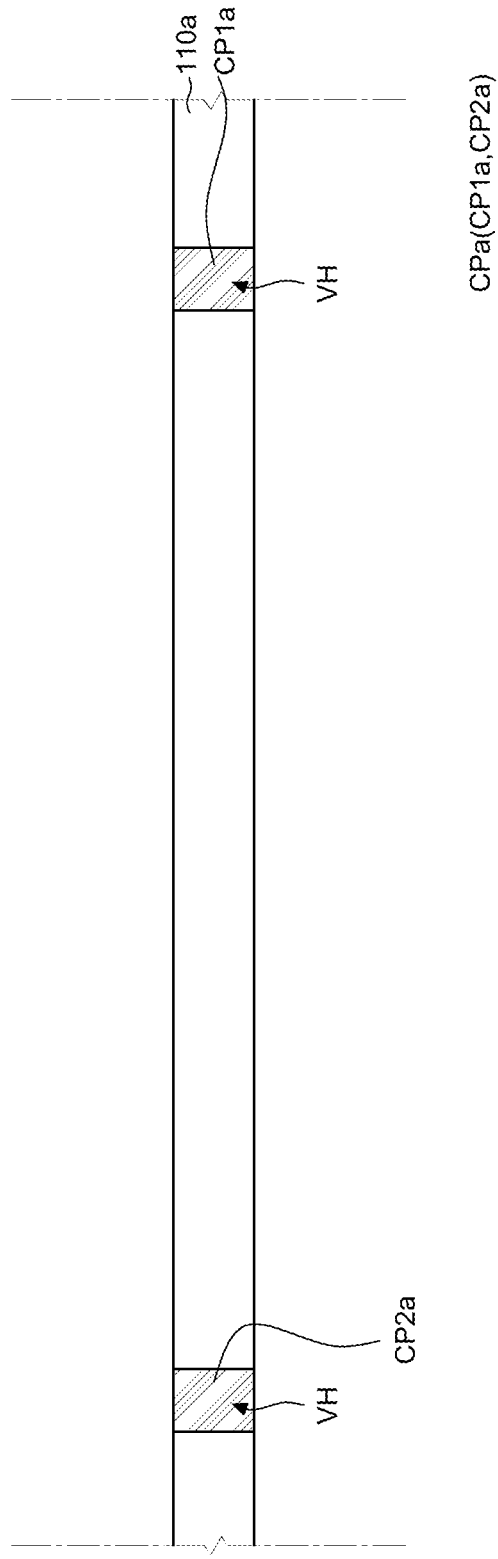
FIGS. 9A to 9E are schematic cross-sectional views for illustrating processing steps of a method of fabricating a display device according to yet another exemplary aspect of the present disclosure.

Referring to FIG. 9A, a plurality of connection units CPa penetrating through the first substrate 110a is formed.

Specifically, a plurality of via holes VH penetrating through the first substrate 110a is formed, and then the via holes VH are filled with a conductive material, to form the connection units CPa.

Figure 9B:
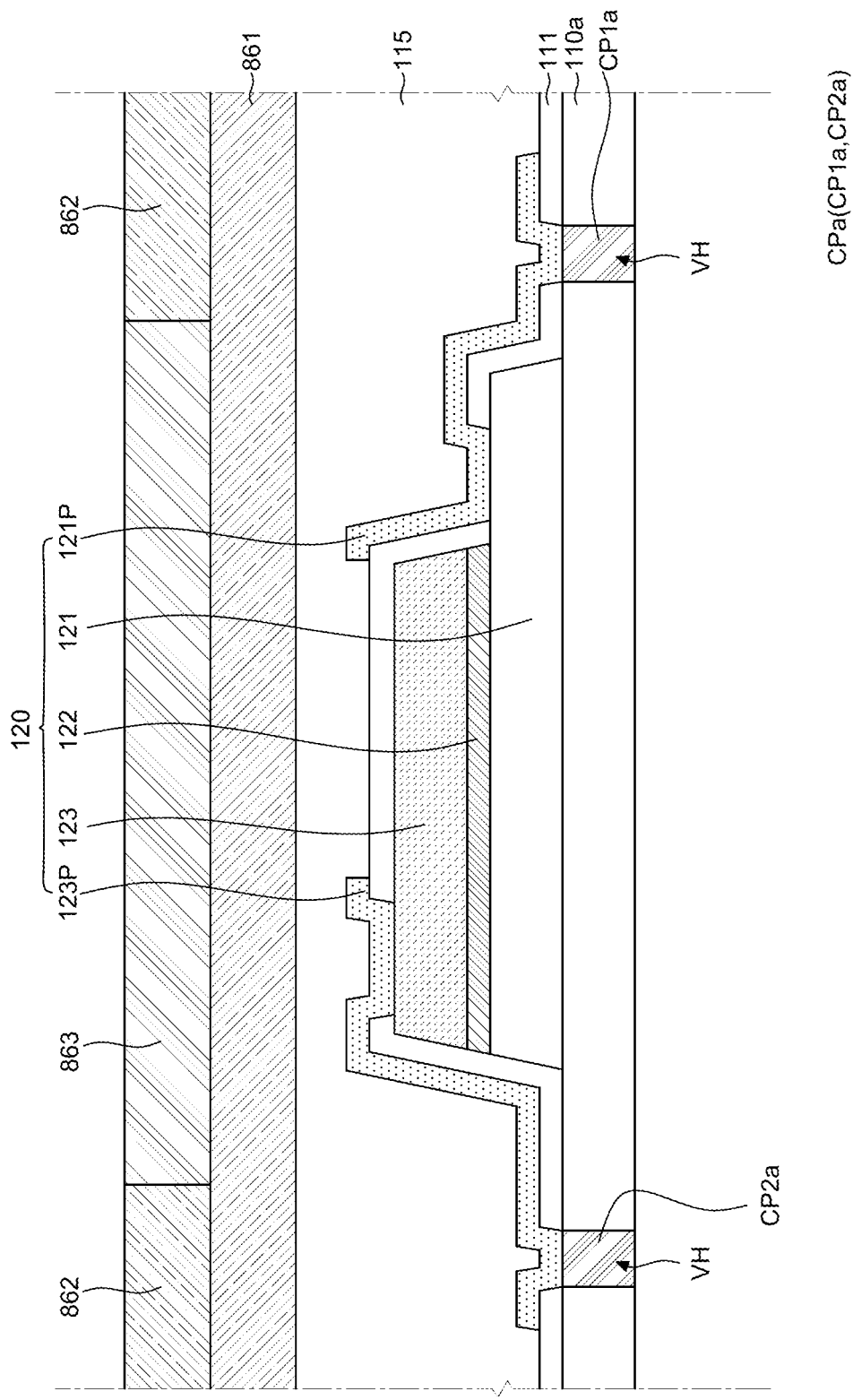

Referring to FIG. 9B, the LEDs 120, the first protective layer 115, the light-converting layer 861, the light-blocking layers 862 and the color filters 863 are formed on the upper surface of the first substrate 110a.

The first pad electrode 121P and the second pad electrode 123P of each of the LEDs 120 formed on the upper surface may be in contact with the connection units CPa, respectively.

Figure 9C:
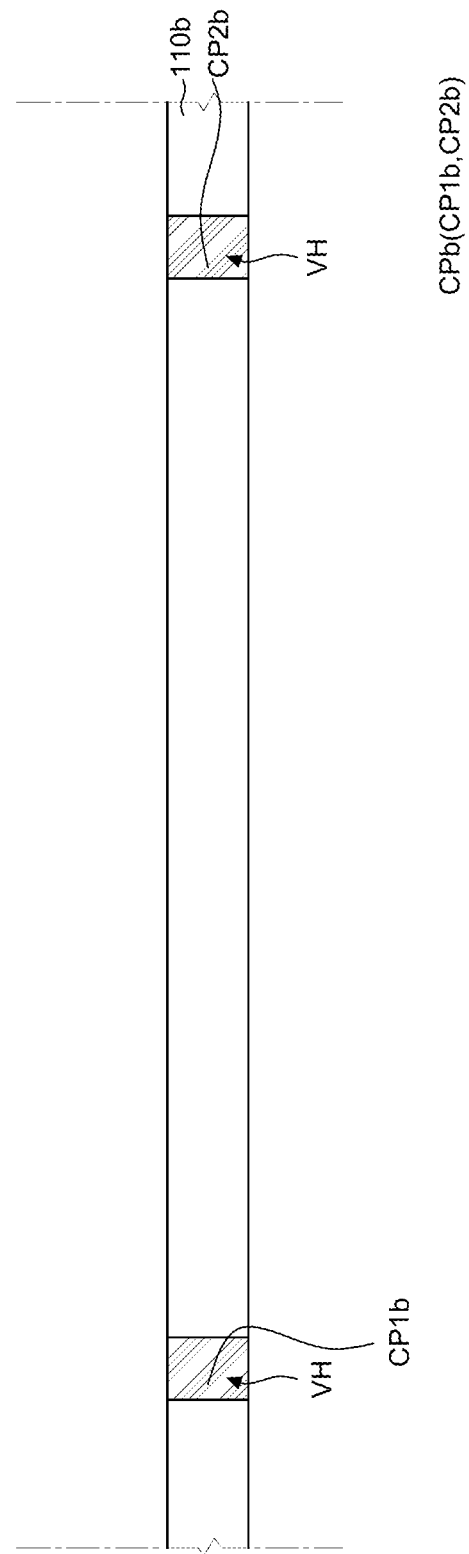

Subsequently, referring to FIG. 9C, a plurality of connection units CPb penetrating through the second substrate 110b is formed.

Specifically, the plurality of via holes VH penetrating through the second substrate 110b is formed, and then the via holes VH are filled with a conductive material, to form the connection units CPb.

Figure 9D:
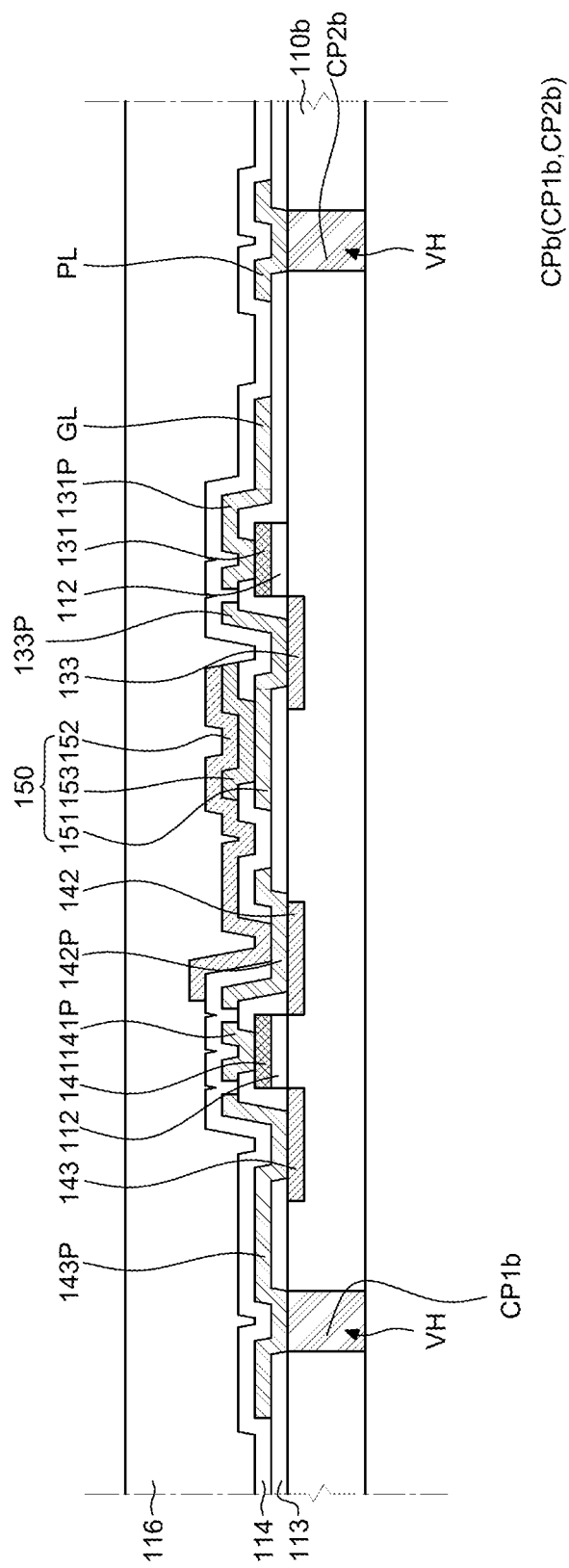

Referring to FIG. 9D, a plurality of first semiconductor elements 130, a plurality of second semiconductor elements 140, a plurality of capacitors 150, a plurality of gate lines GL, a plurality of data lines DL, a plurality of power lines PL and a plurality of common lines CL are formed on the lower surface of the second substrate 110b. The second drain pad electrode 143P electrically connected to the second drain region 143 of the second semiconductor element 140 and the power line PL may be in contact with the connection units CPb.

Subsequently, a second protective layer 116 is formed over the plurality of first semiconductor elements 130, the plurality of second semiconductor elements 140, the plurality of capacitors 150, the plurality of gate lines GL, the plurality of data lines DL, the plurality of power lines PL and the plurality of common lines CL.

Figure 9E:
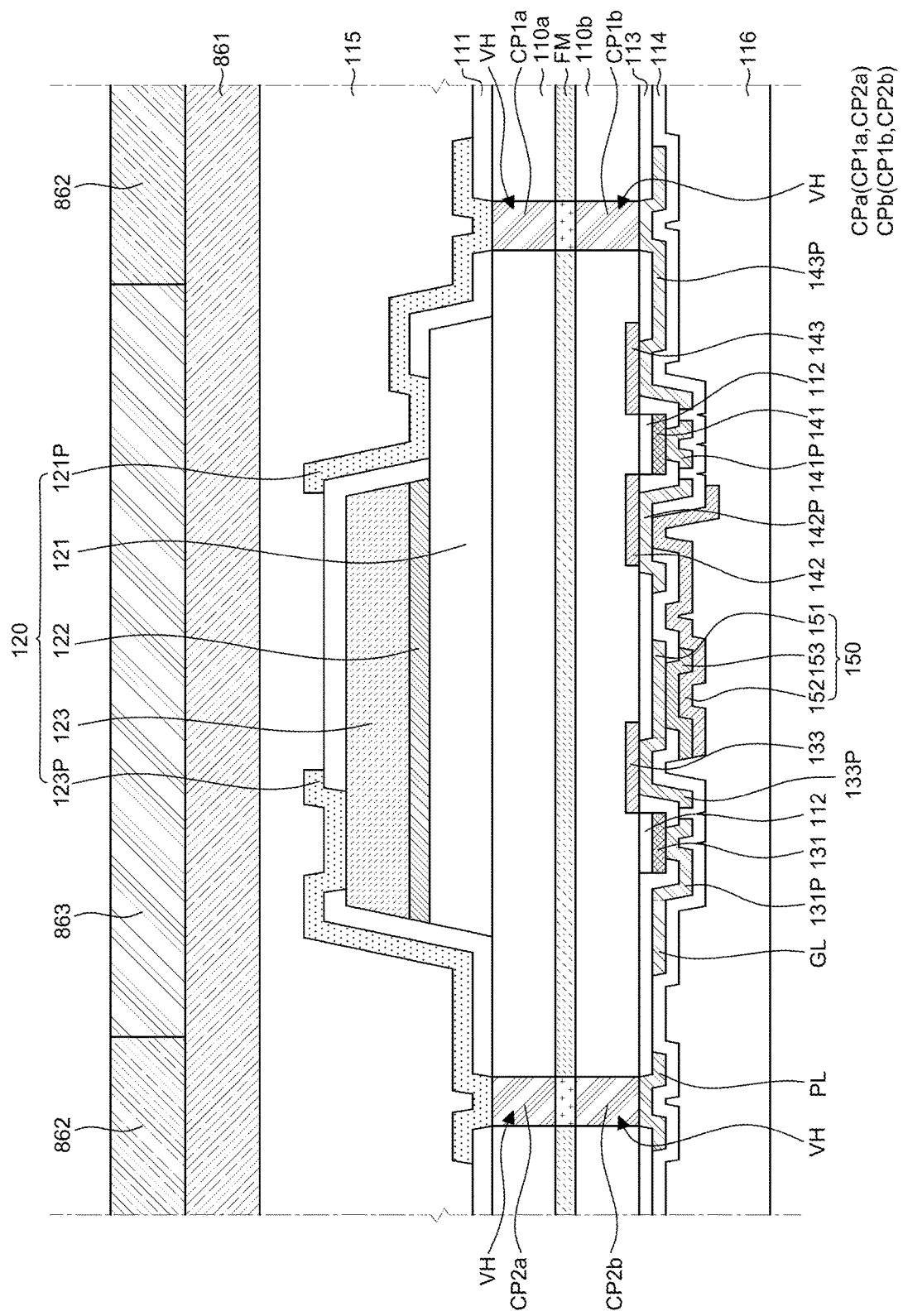

Subsequently, referring to FIG. 9E, the first substrate 110a and the second substrate 110b are attached together so that the lower surface of the first substrate 110a faces the upper surface of the second substrate 110b.

Initially, conductive balls may be formed on the lower surface of the first substrate 110a or the upper surface of the second substrate 110b so that they come in contact with the connection units CPa on the lower surface of the first substrate 110a or the connection units CPb on the upper surface of the second substrate 110b.

Subsequently, the first substrate 110a may be aligned with the second substrate 110b so that the connection units CPa of the lower surface of the first substrate 110a overlaps with the connection units CPb of the upper surface of the second substrate 110b.

In addition, by using the conductive balls on the lower surface of the first substrate 110a or on the upper surface of the second substrate 110b, the connection units CPa of the lower surface of the first substrate 110a can be electrically connected to the connection units CPb of the upper surface of the second substrate 110b, and the first substrate 110a and the second substrate 110b can be attached together. The connection units CPa of the first substrate 110a may be electrically connected to the connection units CPb of the second substrate 110b by any other means than the conductive balls.

Lastly, the filling member FM may be formed between the lower surface of the first substrate 110a and the upper surface of the second substrate 110b. For example, the filling member FM may be formed along the edge portion of each of the lower surface of the first substrate 110a and the upper surface of the second substrate 110b, or may be formed to be in contact with the entire lower surface of the first substrate 110a and the entire upper surface of the second substrate 110b.

According to the method of fabricating a display device according to yet another exemplary aspect of the present disclosure, the LEDs 120 are formed on the first substrate 110a while the plurality of driving units and the plurality of lines are formed on the second substrate 110b separately, it is possible to prevent damage to the driving units and the lines, and to allow for a variety of ways of forming the LEDs 120. For example, when the LEDs 120 are formed by metal organic chemical vapor deposition (MOCVD), an epitaxial layer 120m may be formed at a high temperature between 900 and 1,000° C. If the epitaxial layer 120m is formed on the substrate on which the driving units and the lines are formed, the driving units and the plurality of lines may be damaged by the high temperature. Therefore, in order to avoid damaging the driving units and the lines, the epitaxial layer 120m has to be formed on the substrate by a low-temperature growth technique such as sputtering, so that the epitaxial layer 120m is formed at a low temperature of 480 to 600° C. In contrast, according to the method of fabricating a display device according to yet another exemplary aspect of the present disclosure, the LEDs 120 are formed on the first substrate 110a while the plurality of driving units and the plurality of lines are formed on the second substrate 110b, it is possible to prevent the driving units and lines on the second substrate 110b from being damaged by the temperature of the process of forming the LEDs 120. In addition, the LEDs 120 may be formed via either a high-temperature process or a low-temperature process.

According to the method of fabricating a display device according to yet another exemplary aspect of the present disclosure, it is possible to save processing time by way of forming the LEDs 120 on the substrate different from the substrate on which the driving units and lines are formed. For example, the process of forming the LEDs 120 on the upper surface of the first substrate 110*a* may be carried out simultaneously with and separately from the process of forming the driving units and the plurality of lines on the lower surface of the second substrate 110*b*. If the LEDs 120 and the driving units and the lines are all formed on the same substrate, the process of forming the LEDs 120 and the process of forming the driving units and lines have to be carried out one after another. In contrast, according to the exemplary aspect of the present disclosure, the process of forming the LEDs 120 and the process of forming the driving units and lines can be carried out simultaneously on the upper surface of the first substrate 110*a* and lower surface of the second substrate 110*b*, respectively, thereby reducing the time taken to fabricate the display device.

Figure 10:
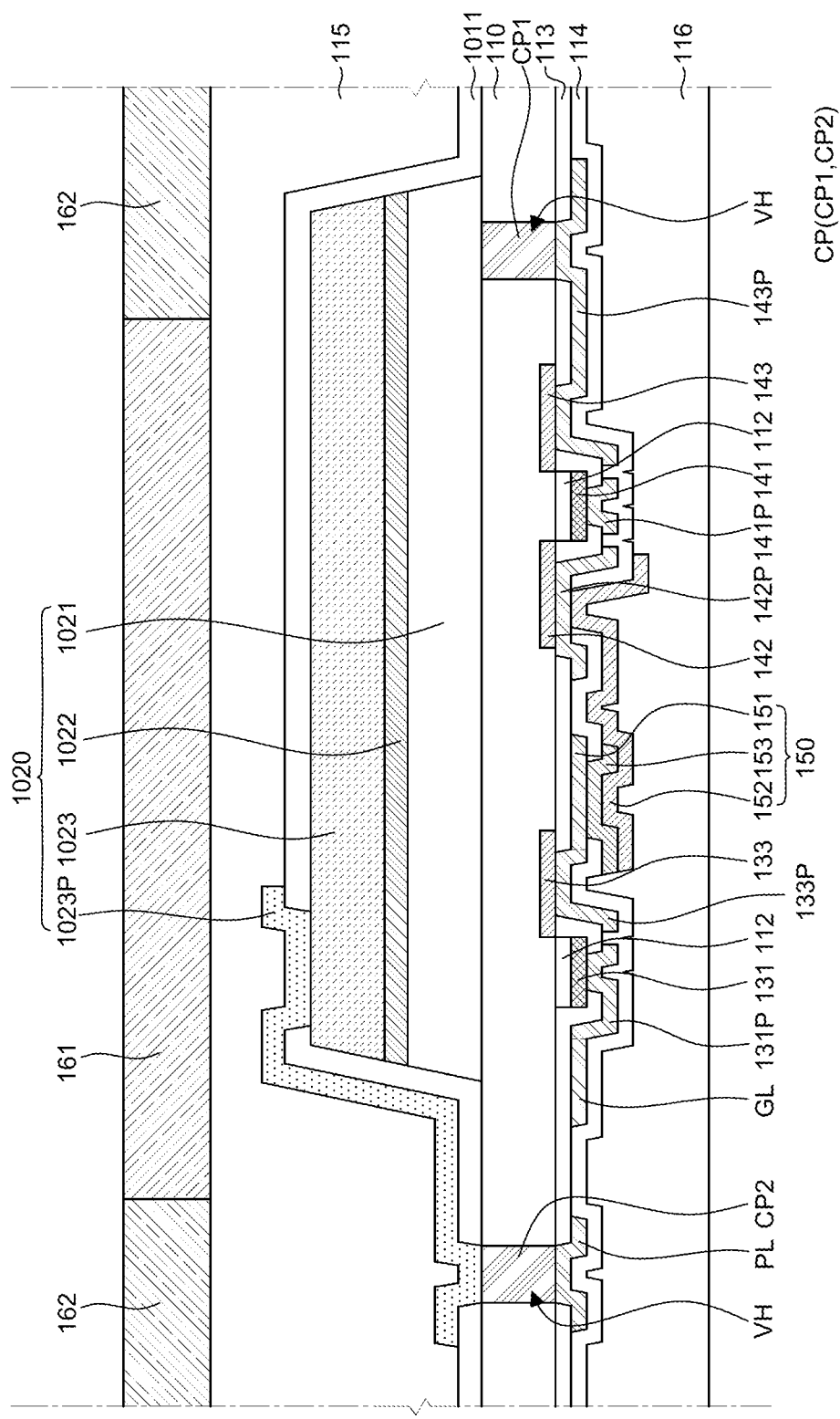
FIG. 10 is a cross-sectional view of a sub-pixel of a display device according to yet another exemplary aspect of the present disclosure.

FIG. 10 is a cross-sectional view of a sub-pixel of a display device according to yet another exemplary aspect of the present disclosure. The display device of FIG. 10 is substantially identical to the display device 100 of FIGS. 1 to 4 except for a plurality of LEDs 1020 and a plurality of first passivation layers 1011; and, therefore, the redundant description will be omitted.

Each of the LEDs 1020 includes a first semiconductor layer 1021, an emissive layer 1022, a second semiconductor layer 1023, and a second pad electrode 1023P.

The first semiconductor layer 1021 is disposed on the substrate 110, the emissive layer 1022 is disposed on the first semiconductor layer 1021, and the second semiconductor layer 1023 is disposed on the emissive layer 1022.

The side surfaces of the first semiconductor layer 1021, the emissive layer 1022, and the second semiconductor layer 1023 are located on the same plane. That is to say, the upper surface of the first semiconductor layer 1021 may overlap with the lower surface of the emissive layer 1022, and the upper surface of the emissive layer 1022 may overlap with the lower surface of the second semiconductor layer 1023.

The first semiconductor layer 1021 may be in contact with one of the plurality of connection units CP. For example, the lower surface of the first semiconductor layer 1021 may be in contact with a first connection unit CP1 electrically connected to a second drain pad electrode 143P on the lower surface of the substrate 110 among the plurality of connection units CP. Thus, the first semiconductor layer 1021 may be electrically connected to the second semiconductor element 140 through the first connection unit CP1 and the second drain pad electrode 143P.

In addition, a contact hole for exposing the first semiconductor layer 1021 from the first passivation layer 1011 may be eliminated. Specifically, as the first semiconductor layer 1021 is in contact with the first connection unit CP1, a contact hole for exposing the first semiconductor layer 1021 to electrically connect it with another pad electrode may be eliminated.

The second semiconductor layer 1023 may be in contact with the second pad electrode 1023P. The second semiconductor layer 1023 may be electrically connected to the second pad electrode 1023P. Specifically, a contact hole may be formed in the first passivation layer 1011 to expose a portion of the upper surface of the second semiconductor layer 1023. The second pad electrode 1023P may be in contact with the upper surface of the second semiconductor layer 1023 through the contact hole, such that the second pad electrode 1023P can be electrically connected to the second semiconductor layer 1023.

Then, the second pad electrode 1023P may be in contact with one of the connection units CP. For example, the second pad electrode 1023P may be in contact with the second connection unit CP2 electrically connected to the power line PL on the lower surface of the substrate 110 among the plurality of connection units CP. Accordingly, the second semiconductor layer 1023 may be electrically connected to the power line PL through the second pad electrode 1023P and the second connection CP2.

In the display device according to yet another exemplary aspect of the present disclosure, the LEDs 1020 have a vertical structure in which the electrodes are disposed on and under the emissive layer 1022, and the plurality of connection units CP replaces the first pad electrode connected to the first semiconductor layer 1021. As a result, the structure of the display device can be simplified. Specifically, for the LEDs 1020 having a vertical structure, it is not necessary to expose the upper surface of the first semiconductor layer 1021 under the emissive layer 1022, and the area of the emissive layer 1022 may be formed equal to the area of each of the first semiconductor layer 1021 and the second semiconductor layer 1023. That is to say, as the electrode for applying voltage to the first semiconductor layer 1021 is in contact with the lower surface of the first semiconductor layer 1021, it is not necessary to etch the emissive layer 1022 covering the upper surface of the first semiconductor layer 1021, such that the area of the emissive layer 1022 can be increased. In addition, the first connection units CP may be in contact with the lower surface of the first semiconductor layer 1021, so that it can supply voltage from the second drain region 143 of the second semiconductor element 140 to the first semiconductor layer 1021. As such, in the display device according to the exemplary aspect of the present disclosure, the first connection unit CP1 among the plurality of connection units CP is in contact with the lower surface of the first semiconductor layer 1021, so that the structure of the LEDs 1020 can be simplified. Additionally, the LEDs 1020 can be implemented to having a vertical structure, so that the area of the emissive layer 1022 of the LEDs can be increased, and thus the luminous efficiency of the LEDs 1020 can be improved.

The exemplary aspects of the present disclosure can also be described as follows:

According to an aspect of the present disclosure, there is provided a display device. The display device includes a substrate having a plurality of sub-pixels defined thereon, a plurality of LEDs disposed on the substrate in the sub-pixels, respectively, wherein each of the LEDs comprises an emissive layer, a first semiconductor layer between the substrate and the emissive layer, and a second semiconductor layer on the emissive layer, a plurality of driving units disposed under the substrate in each of the sub-pixels, and a plurality of connection units penetrating the substrate to electrically connect the first semiconductor layer and/or the second semiconductor layer with the driving units.

The first semiconductor layer, the emissive layer and the second semiconductor layer of each of the LEDs may be grown in the substrate, and the emissive layer of each of the LEDs may overlap at least a part of the driving units.

The connection units may be disposed in each of the sub-pixels.

Each of the LEDs may further include a first pad electrode having an end in contact with the first semiconductor layer and another end in contact with one of the connection units, and a second pad electrode having an end in contact with the second semiconductor layer and another end in contact with another one of the connection units.

An end of one of the connection units may be in contact with a lower surface of the first semiconductor layer. Each of the LEDs may further include a second pad electrode having an end in contact with the second semiconductor layer and another end in contact with another one of the connection units.

The substrate may include a first substrate on which the LEDs are disposed and a second substrate disposed below the first substrate. The driving units may be disposed under the second substrate.

The display device may further include a filling member between the first substrate and the second substrate.

The display device may further include a plurality of light-converting layer disposed above the LEDs to overlap them, and a plurality of light-blocking layers disposed between the light-converting layers.

The LEDs may emit blue light, and the light-converting layers may be yellow light-converting layers. The display device may further include a plurality of color filters disposed on the yellow light-converting layers.

The display device may further include a power line disposed under substrate and applying supply voltage to each of the driving units. Each of the driving units may include a first semiconductor element comprising a first source region and a first drain region spaced apart from each other, a second semiconductor element comprising a second gate electrode electrically connected to the first drain region, and a capacitor comprising a first capacitor electrode between the first drain region and the second gate electrode and a second capacitor electrode electrically connected to a second drain region of the second semiconductor element. One of the first semiconductor layer and the second semiconductor layer may be electrically connected to the second drain region through the connection units, and the other one of the first semiconductor layer and the second semiconductor layer may be electrically connected to the power line through the connection units.

The first semiconductor layer of each of the LEDs may be in contact with one surface of the substrate. At least a part of the plurality of driving units may be in contact with the other surface opposite to the one surface of the substrate.

The display device may further include a plurality of lines disposed on the other surface of the substrate in the sub-pixels, respectively. At least a part of the plurality of lines and an elements of the plurality of driving unit may be disposed on the same layer. The plurality of lines may further include a gate line, data line, power line and common line.

The first semiconductor layer or the second semiconductor layer may be electrically connected to the plurality of lines by the plurality of connection units. Another end of another one of the connection units and the other surface of the substrate may be disposed on the same layer. Another end of another one of the connection units may be in contact with at least a part of the plurality of lines.

According to another aspect of the present disclosure, there is provided a display device. The display device includes a plurality of light-emitting elements emitting light, a substrate having a first surface on which the plurality of light-emitting elements mounted, a plurality of driving units and a plurality of lines mounted on a second surface of the substrate so as to increase an emission area of the light-emitting elements, wherein the second surface is opposed to the first surface, and a plurality of connection units, wherein ends of the connection units are in contact with each of the light-emitting elements on the first surface, while opposite ends of the connection units are extended from the ends to penetrate through the substrate and in contact with the driving units and lines on the second substrate.

The substrate may include a first substrate comprising the first surface on which the light-emitting elements are mounted, and a second substrate comprising the second surface on which the driving units are mounted. A surface opposite to the first surface of the first substrate may face a surface opposite to the second surface of the second substrate, and a filling member may be disposed between the first substrate and the second substrate.

The display device may further include a plurality of light-converting layers disposed above the plurality of light-emitting elements and converting light emitted from the plurality of light-emitting elements into light of one or more different colors.

Each of the plurality of light-emitting elements may include a first semiconductor layer on the first surface, an emissive layer on the first semiconductor layer, a second semiconductor layer on the emissive layer, and a second pad electrode electrically connected to the second semiconductor layer. Some of the connection units may be in contact with the second pad electrode on the first surface.

The others of the connection units may be in contact with the first semiconductor layer on the first surface. Each of the light-emitting elements may further include a first pad electrode electrically connected to the first semiconductor layer, and the others of the connection units may be in contact with the first pad electrode on the first surface.

According to yet another aspect of the present disclosure, there is provided a method of fabricating a display device. The method includes forming a plurality of LEDs on a substrate, each of the LEDs comprising a first semiconductor layer, an emissive layer on the first semiconductor layer, and a second semiconductor layer on the emissive layer, and forming a plurality of driving units and a plurality of lines under the substrate, the LEDs are electrically connected to the driving units and the lines by a plurality of connection units penetrating through the substrate.

The forming the LEDs may include forming a first semiconductor material layer, a light-emitting material layer and a second semiconductor material layer on the substrate sequentially, to form an epitaxial layer, and etching the epitaxial layer to form the first semiconductor layer, the emissive layer on the first semiconductor layer and the second semiconductor layer on the emissive layer of each of the LEDs.

The forming the LEDs may further include forming a first pad electrode so that its end is in contact with the first semiconductor layer, and forming a second pad electrode so that its end is in contact with the second semiconductor layer, and each of the LEDs may include the first semiconductor layer, the emissive layer, the second semiconductor layer, the first pad electrode and the second pad electrode.

The forming the LEDs may further include forming a second pad electrode so that its end is in contact with the semiconductor layer, each of the LEDs may include the first semiconductor layer, the emissive layer, the second semiconductor layer and the second pad electrode. The etching the epitaxial layer to form the first semiconductor layer, the emissive layer and the second semiconductor layer of each of the LEDs may include etching the epitaxial layer so that one of the connection units overlaps with the first semiconductor layer.

The method may further include forming a plurality of grooves under the substrate where the LEDs are not formed, forming a plurality of via holes penetrating through the substrate from the grooves of the substrate where the LEDs are formed, and forming the connection units by filling the via holes with a conductive material. The forming the LEDs may include forming the LEDs on the substrate where the grooves are formed. The forming the driving units and the lines may include forming the driving units and the lines under the substrate where the connection units are formed.

The forming the grooves may further include forming an alignment hole penetrating through the substrate together with the grooves, and the forming the LEDs may include forming the LEDs on the substrate where the grooves and the alignment hole are formed.

The method may further include forming a plurality of via holes penetrating through the substrate, and forming the connection units by filling that via holes with a conductive material. The forming the epitaxial layer may include forming the epitaxial layer on the substrate where the connection units are formed.

The method may further include forming a plurality of via holes penetrating through the substrate, and forming the connection units by filling that via holes with a conductive material. The forming the epitaxial layer may include forming the epitaxial layer on the substrate where the via holes are formed. The forming the connection units may include forming the connection units after forming the epitaxial layer on the substrate.

The method may further include etching the epitaxial layer to form the first semiconductor layer, the emissive layer and the second semiconductor layer of each of the LEDs, and then forming a plurality of via holes penetrating through the substrate, and forming the connection units by filling the via holes with a conductive material.

The method may further include forming a plurality of via holes penetrating through the substrate after forming the epitaxial layer on the substrate, and forming the connection units by filling the via holes with a conductive material. The etching the epitaxial layer to form the first semiconductor layer, the emissive layer and the second semiconductor layer of each of the LEDs may include etching the epitaxial layer after the forming the connection units in the substrate.

The method may further include forming a plurality of light-blocking layers above the LEDs such that they are located between the LEDs, and forming a plurality of light-converting layers above the LEDs such that they are located between the light-blocking layers.

The substrate may include a first substrate having the plurality of LEDs formed thereon, and a second substrate having the plurality of driving units and the plurality of lines formed thereunder. The method may further include attaching the first substrate and the second substrate together so that a lower surface of the first substrate on which the LEDs are formed faces an upper surface of the second substrate on which the driving units are formed, and filling a space between the first substrate and the second substrate with a filling member.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate having a plurality of sub-pixels;
   a plurality of LEDs respectively disposed in the plurality of sub-pixels, wherein each of the LEDs comprises an emissive layer, a first semiconductor layer between the substrate and the emissive layer and a second semiconductor layer on the emissive layer;
   a plurality of driving units disposed under the substrate in each of the sub-pixels;
   a plurality of connection units penetrating the substrate and electrically connecting at least one of the first semiconductor layer and the second semiconductor layer with the plurality of driving units;
   a first pad electrode having an end in contact with the first semiconductor layer and another end in contact with one of the plurality of connection units; and
   a second pad electrode having an end in contact with the second semiconductor layer and another end in contact with another one of the plurality of connection units.

2. The display device of claim 1, wherein the first semiconductor layer, the emissive layer and the second semiconductor layer of each of the LEDs are grown from the substrate, and
   wherein the emissive layer of each of the LEDs overlaps at least a part of the plurality of driving units.

3. The display device of claim 1, wherein the connection units are disposed in each of the sub-pixels.

4. The display device of claim 1, wherein the substrate comprises:
   a first substrate on which the LEDs are disposed; and
   a second substrate disposed below the first substrate,
   wherein the plurality of driving units is disposed under the second substrate.

5. The display device of claim 4, further comprising a filling member between the first substrate and the second substrate.

6. The display device of claim 1, further comprising:
   a plurality of light-converting layer disposed above the LEDs and overlapping the LEDs; and
   a plurality of light-blocking layers disposed between the light-converting layers.

7. The display device of claim 6, wherein the LEDs emit blue light, and the light-converting layers are yellow light-converting layers.

8. The display device of claim 7, further comprising a plurality of color filters disposed on the yellow light-converting layers.

9. The display device of claim 1, further comprising a power line disposed under substrate and applying supply voltage to each of the driving units,
   wherein each of the driving units comprises:
   a first semiconductor element comprising a first source region and a first drain region spaced apart from each other;
   a second semiconductor element comprising a second gate electrode electrically connected to the first drain region; and a capacitor comprising a first capacitor electrode between the first drain region and the second gate electrode and a second capacitor electrode electrically connected to a second drain region of the second semiconductor element, wherein one of the first semiconductor layer and the second semiconductor layer is electrically connected to the second drain region through the connection units, and wherein the other one of the first semiconductor layer and the second semiconductor layer is electrically connected to the power line through the connection units.

10. The display device of claim 1, wherein the first semiconductor layer of each of the LEDs are in contact with one surface of the substrate, wherein at least a part of the plurality of driving units are in contact with the other surface opposite to the one surface of the substrate.

11. The display device of claim 10, further comprising a plurality of lines disposed on the other surface of the substrate in the sub-pixels, wherein at least a part of the plurality of lines and an elements of the plurality of driving unit are disposed on the same layer, and wherein the plurality of lines further comprises a gate line, data line, power line and common line.

12. The display device of claim 11, wherein the first semiconductor layer or the second semiconductor layer is electrically connected to the plurality of lines by the plurality of connection units, wherein another end of another one of the connection units and the other surface of the substrate are disposed on the same layer, and wherein another end of another one of the connection units are in contact with at least a part of the plurality of lines.

13. A display device comprising:

a substrate having a plurality of sub-pixels;

a plurality of LEDs respectively disposed in the plurality of sub-pixels, wherein each of the LEDs comprises an emissive layer, a first semiconductor layer between the substrate and the emissive layer and a second semiconductor layer on the emissive layer;

a plurality of driving units disposed under the substrate in each of the sub-pixels; and a plurality of connection units penetrating the substrate and electrically connecting at least one of the first semiconductor layer and the second semiconductor layer with the plurality of driving units, wherein an end of one of the plurality of connection units is in contact with a lower surface of the first semiconductor layer, and wherein each of the LEDs further comprises a second pad electrode having an end in contact with the second semiconductor layer and another end in contact with another one of the connection units.

14. A display device comprising:

a plurality of light-emitting elements emitting light;

a substrate having a first surface on which the plurality of light-emitting elements mounted;

a plurality of driving units and a plurality of lines mounted on a second surface of the substrate so as to increase an emission area of the light-emitting elements, wherein the second surface is opposed to the first surface;

a plurality of connection units having one end in contact with each of the light-emitting elements on the first surface and an opposite end extended from the one end, penetrating through the substrate and in contact with the plurality of driving units and the plurality of lines disposed on the second surface;

a first substrate comprising the first surface on which the plurality of light-emitting elements mounted; and a second substrate comprising the second surface on which the plurality of driving units mounted, wherein a surface opposite to the first surface of the first substrate faces a surface opposite to the second surface of the second substrate, and wherein the display device further comprises a filling member disposed between the first substrate and the second substrate.

15. The display device according to claim 14, further comprising a plurality of light-converting layers disposed above the plurality of light-emitting elements and converting light emitted from the plurality of light-emitting elements into light of one or more different colors.

16. The display device of claim 14, wherein each of the plurality of light-emitting elements comprises:

a first semiconductor layer on the first surface;

an emissive layer on the first semiconductor layer;

a second semiconductor layer on the emissive layer; and a second pad electrode electrically connected to the second semiconductor layer, wherein some of the connection units are in contact with the second pad electrode on the first surface.

17. The display device of claim 16, wherein the others of the connection units are in contact with the first semiconductor layer on the first surface.

18. The display device of claim 16, wherein each of the light-emitting elements further comprises a first pad electrode electrically connected to the first semiconductor layer, and wherein the others of the connection units are in contact with the first pad electrode on the first surface.

* * * * *